(12) United States Patent
Takizawa et al.

(10) Patent No.: US 10,658,055 B2
(45) Date of Patent: May 19, 2020

(54) MEMORY SYSTEM AND METHOD FOR CONTROLLING MEMORY SYSTEM

(71) Applicant: Toshiba Memory Corporation, Minato-ku, Tokyo (JP)

(72) Inventors: Kazutaka Takizawa, Yokohama Kanagawa (JP); Yoshihisa Kojima, Kawasaki Kanagawa (JP); Masaaki Niijima, Machida Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/919,492

(22) Filed: Mar. 13, 2018

(65) Prior Publication Data

US 2018/0277229 A1 Sep. 27, 2018

(30) Foreign Application Priority Data

Mar. 24, 2017 (JP) .................................. 2017-059542

(51) Int. Cl.
G11C 16/34 (2006.01)
G11C 16/04 (2006.01)

(52) U.S. Cl.
CPC ...... *G11C 16/3445* (2013.01); *G11C 16/3454* (2013.01); *G11C 16/0483* (2013.01)

(58) Field of Classification Search
CPC ............ G11C 16/3445; G11C 16/3454; G11C 16/0483
See application file for complete search history.

(56) References Cited

U.S. PATENT DOCUMENTS

| 7,020,017 | B2 | 3/2006 | Chen et al. |
| 7,894,269 | B2 | 2/2011 | Li |
| 2003/0067813 | A1* | 4/2003 | Nagamine ............... G11C 5/063 365/49.11 |
| 2006/0120162 | A1* | 6/2006 | Fujiu .................... G11C 11/5628 365/185.24 |
| 2007/0064482 | A1 | 3/2007 | Takeuchi |
| 2007/0291567 | A1 | 12/2007 | Mokhlesi et al. |
| 2012/0134213 | A1 | 5/2012 | Choi et al. |
| 2012/0213005 | A1 | 8/2012 | Lee |
| 2012/0243329 | A1 | 9/2012 | Nagashima |
| 2013/0279260 | A1* | 10/2013 | Yoon ................... G11C 16/0483 365/185.18 |
| 2016/0071581 | A1* | 3/2016 | Lee ..................... G11C 11/5671 365/185.03 |

(Continued)

FOREIGN PATENT DOCUMENTS

JP 2007-087526 A 4/2007
JP 2009-301621 A 12/2009

(Continued)

*Primary Examiner* — Mohammed A Bashar
(74) *Attorney, Agent, or Firm* — White & Case LLP

(57) ABSTRACT

According to one embodiment, a memory system includes a memory device and a controller. The controller is configured to make the memory device apply a first verify voltage to a first word line for determining whether writing of a first data value into a first cell transistor has been completed. The controller is configured to make the memory device apply a second verify voltage to a second word line for determining whether writing of the first data value into a second cell transistor has been completed. The second verify voltage is different from the first verify voltage.

20 Claims, 19 Drawing Sheets

(56) References Cited

U.S. PATENT DOCUMENTS

2016/0300621 A1 10/2016 Abe et al.
2017/0186494 A1* 6/2017 Kim .................. G11C 16/3495

FOREIGN PATENT DOCUMENTS

| JP | 4884372 B2 | 2/2012 |
| JP | 2012-113810 A | 6/2012 |
| JP | 2012-133832 A | 7/2012 |
| JP | 2012-174331 A | 9/2012 |
| JP | 2012-203692 A | 10/2012 |
| WO | 2015092879 A1 | 6/2015 |
| WO | 2016209563 A1 | 12/2016 |

* cited by examiner

FIG. 9

| WL ADDRESS | ADJUSTMENT VALUE $\Delta$Vvf |
|---|---|
| WL0 | $\Delta$Vvf0 |
| WL1 | $\Delta$Vvf1 |
| WL2 | $\Delta$Vvf2 |
| WL3 | $\Delta$Vvf3 |
| ⋮ | ⋮ |
| WL14 | $\Delta$Vvf14 |
| WL15 | $\Delta$Vvf15 |

| WL ADDRESS | ADJUSTMENT VALUE $\Delta$Vvf | | |
|---|---|---|---|
| | VERIFICATION FOR A STATE | VERIFICATION FOR B STATE | VERIFICATION FOR C STATE |
| WL0 | $\Delta$VvfA0 | $\Delta$VvfB0 | $\Delta$VvfC0 |
| WL1 | $\Delta$VvfA1 | $\Delta$VvfB1 | $\Delta$VvfC1 |
| WL2 | $\Delta$VvfA2 | $\Delta$VvfB2 | $\Delta$VvfC2 |
| WL3 | $\Delta$VvfA3 | $\Delta$VvfB3 | $\Delta$VvfC3 |
| ⋮ | ⋮ | ⋮ | ⋮ |
| WL14 | $\Delta$VvfA14 | $\Delta$VvfB14 | $\Delta$VvfC14 |
| WL15 | $\Delta$VvfA15 | $\Delta$VvfB15 | $\Delta$VvfC15 |

T2

MEMORY SYSTEM AND METHOD FOR CONTROLLING MEMORY SYSTEM

CROSS-REFERENCE TO RELATED APPLICATION

This application is based upon and claims the benefit of priority from Japanese Patent Application No. 2017-059542, filed Mar. 24, 2017; the entire contents of which are incorporated herein by reference.

FIELD

Embodiments described herein relate generally to a memory system and a method for controlling a memory system.

BACKGROUND

Memory systems each including nonvolatile memory devices and a memory controller controlling the memory devices are known.

BRIEF DESCRIPTION OF THE DRAWINGS

FIG. 9 is a diagram showing an example of a content of an adjustment value management table according to the first embodiment;

FIG. 10 is a diagram showing another example of a content of the adjustment value management table according to the first embodiment;

DETAILED DESCRIPTION

Figure 1:
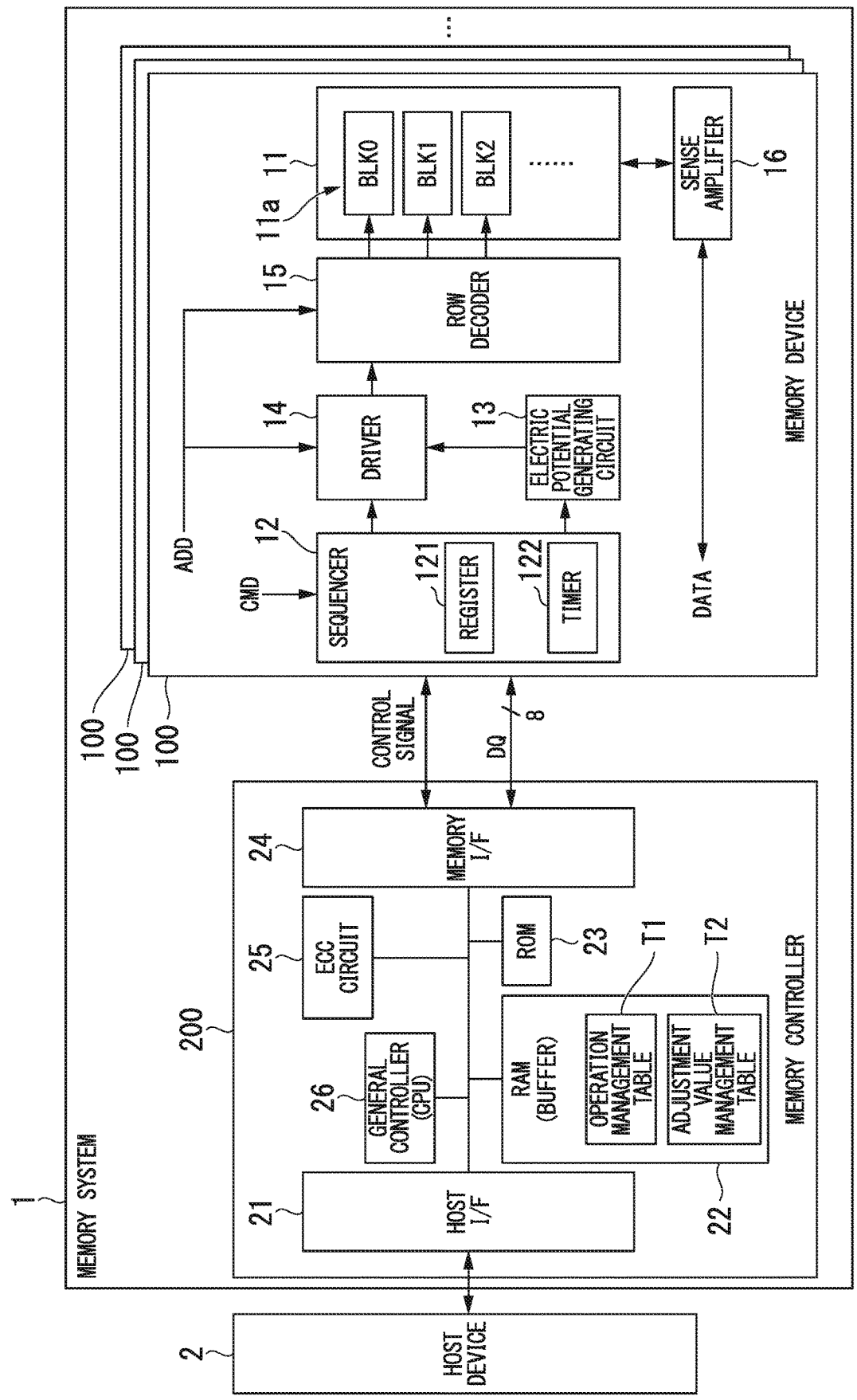
FIG. 1 is a block diagram showing a configuration of a memory system according to a first embodiment.

According to one embodiment, a memory system includes a memory device and a controller. The memory device includes a first cell transistor, a second cell transistor, a first word line, and a second word line. The first word line is connected to the first cell transistor. The second word line is connected to the second cell transistor. The memory device is configured to write any one data value among one or more data values into each of the first call transistor and the second cell transistor. The controller is configured to make the memory device apply a first verify voltage to the first word line for determining whether writing of a first data value into the first cell transistor has been completed. The first data value is one of the one or more data values. The controller is configured to make the memory device apply a second verify voltage to the second word line for determining whether writing of the first data value into the second cell transistor has been completed. The second verify voltage is different from the first verify voltage.

Hereinafter, memory systems and methods for controlling memory systems according to embodiments will be described with reference to the drawings. In the following description, configurations having the same or similar functions are designated by the same reference numerals. And, duplicate descriptions of these components may be omitted. In the present application, each of terms "the basis of XX" and "based on XX" means "based at least on XX". That is, each of the terms "the basis of XX" and "based on XX" includes cases of being based on at least any one of other elements in addition to XX. Further, each of terms "the basis of XX" and "based on XX" is not limited to a case where XX is directly used but also includes a case where a value that is acquired by performing a calculation or another process with XX is used. Here, "XX" is any element (for example, any setting value, any reference, any physical quantity, or any other information). In addition, "connection" in this application is not limited to a direct connection but also includes an electrical connection through at least one conductor.

A memory system according to an embodiment, for example, can realize both an increase in a writing speed of the memory system and a decrease in the number of error bits upon reading, since the memory system has an improvement of writing. For example, the memory system according to this embodiment may achieve an increase in the writing speed by enlarging a program voltage increment $\Delta V_{pgm}$ (to be described later) between programming loops at the time of writing data. However, if the increment $\Delta V_{pgm}$ becomes large, the width of a distribution of threshold voltages of cell transistors for each data value is increased, and there are cases where the number of error bits upon reading increases. Therefore, the memory system according to this embodiment adjusts at least a verify voltage, which is used for determining the completion of writing a data value, for example, in accordance with variations in the degree of easiness in writing data into cell transistors based on the physical locations of word lines, other characteristics, and the like, whereby an increase in the width of the distribution of the threshold voltages of cell transistors is suppressed. Accordingly, even in a case where a large increment ΔVpgm is used, the memory system may decrease the number of error bits upon reading.

(First Embodiment)

<1.1. Configuration (Structure)>

<1.1.1. Memory System>

FIG. 1 is a block diagram showing a configuration of a memory system 1 according to a first embodiment. As shown in FIG. 1, the memory system 1 serves as a storage device for a host device 2. For example, the memory system 1 communicates with the host device 2, and stores data received from the host device 2 and transmits data to the host device 2 on the basis of instructions (commands) from the host device 2.

The host device 2, for example, is a server computer, a personal computer, or the like, performs information processing and stores data by using the memory system 1. A storage space of the memory system 1 is divided into a plurality of logical areas, and each logical area is identified with a logical address. The host device 2 manages the storage space of the memory system 1 by using the logical addresses. When the host device 2 determines to store writing target data in the storage space of the memory system 1, the host device 2 assigns a logical area for the writing target data. Then, the host device 2 causes the memory system 1 to write the writing target data into the logical area specifying a logical address that corresponds to the logical area. In addition, the host device 2 specifies a reading target data in the memory system 1 by using the logical address.

The memory system 1, for example, is a memory card such as an SD (Trademark) card, or a solid state device (SSD). The memory system 1 includes a plurality of memory devices 100 and a memory controller 200. The memory devices 100 and the memory controller 200 may be implemented in chips, sealed (using a resin, for example) in different packages. Alternatively, the memory devices 100 and the memory controller 200 may be implemented in one chip or a plurality of chips, sealed in one package.

The plurality of memory devices 100 have the same elements and connections each other. Therefore, hereinafter, one memory device 100 will be representatively described. The description of the representative memory device 100 is applicable also to other memory devices 100. The memory device 100 is a memory device storing data in a nonvolatile manner, and is a NAND flash memory, for example.

The memory controller 200 includes a memory (for example, a RAM 22 to be described later) inside the memory controller 200 and receives an instruction from the host device 2, and controls the memory device 100. The control of the memory device 100 includes a control operation regardless of an instruction received from the host device 2 and a control operation that is based on an instruction received from the host device 2. For example, the memory controller 200 writes data that is instructed by the host device 2 to be written into the memory device 100. In addition, the memory controller 200 reads data instructed by the host device 2 to be read from the memory device 100 and transmits the read data to the host device 2.

In addition, the memory controller 200 manages the memory device 100. The management of the memory controller 200 includes management of mapping of addresses and management of the states of the memory device 100. Here, the term "mapping of addresses" is mapping associating the logical addresses with physical addresses. The term "physical address" is information specifying a storage area of the memory device 100. For example, when writing is instructed, the memory controller 200 maintains, in an address translation table, the physical address of the storage area in the memory device 100 into which the data is written, in association with the logical address designated in the write instruction. When reading of data in a storage area of a certain logical address is instructed, the memory controller 200 acquires the physical address associated with the logical address by referring to the address translation table and reads the data from the storage area of the acquired physical address.

The management of the states of the memory device 100 includes management of defective storage areas (blocks BLK to be described later) of the memory device 100, wear leveling, garbage collection, refreshing, and the like. Here, the term "referring" means acquiring information from a functional unit or a physical element storing the information. The term "referring to information" by a certain functional unit, includes a case where information is acquired from another functional unit or a physical element which are disposed outside the certain functional unit and a case where information is acquired from a sub functional unit or a physical element which are disposed inside the certain functional unit. The term "acquiring" means turning into a state in which certain information can be handled (for example, transmitted or used for calculation). Each of terms "referring" and "acquiring" may be replaced by "getting", "obtaining", or the like.

<1.1.2. Memory Controller>

The memory controller 200 includes a host interface 21, a random access memory (RAM) 22, a read only memory (ROM) 23, a memory interface 24, an ECC circuit 25, and a general controller 26. The memory controller 200, for example, includes a processor such as a central processing unit (CPU) as hardware. By loading firmware (program) stored in the ROM 23 into the RAM 22 and executing the firmware with the processor, a part or the whole of the function of each of the host interface 21, the memory interface 24, the ECC circuit 25, and the general controller 26 is performed. The host interface 21, the RAM 22, the ROM 23, the memory interface 24, the ECC circuit 25, and the general controller 26 are interconnected through at least one bus.

The host interface 21 includes hardware elements and/or software required for connecting the memory controller 200 and the host device 2 such that they are able to communicate in compliance with a communication standard. In other words, the host interface 21 includes hardware (for example, a connector and/or pins) used for a physical connection to the host device 2 using a bus and is connected to the host device 2 through the bus. In addition, the host interface 21 performs various processes enabling the memory controller 200 and the host device 2 to communicate with each other according to a communication standard with which the host interface 21 is compliant. Examples of the host interface 21 and/or the communication standard with which the host interface 21 is compliant include the advanced technology attachment (ATA), the serial ATA (SATA), the serial attached small computer system interface (SAS), and the peripheral component interconnect express (PCIe).

The RAM 22, for example, is a volatile memory. The RAM 22 is an example of a memory provided in the memory controller 200. The RAM 22 temporarily stores data and has a function of a buffer. The data stored in the RAM 22 includes data received from the host device 2, data that is to be transmitted to the host device 2, data (write data) that is to be written into the memory device 100, data (read data) read from the memory device 100, the firmware, and various kinds of management data that represent the states of the memory device 100 and is referred to by the general controller 26 for controlling the memory device 100. The management data includes the address translation table, an operation management table T1, and an adjustment value management table T2.

In the operation management table T1, the values of various parameters influencing the performance or the operation of the memory device 100 are managed. Examples of the various parameters include the values of voltages (including the program (write) voltages, read voltages, and verify voltages (to be described later)) applied to word lines WL and bit lines BL and the like. In the adjustment value management table T2, a plurality of adjustment values (offset values) used for adjusting voltage levels of the verify voltages are managed. The adjustment value management table T2 will be described later in detail. Here, for the convenience of description, while the operation management table T1 and the adjustment value management table T2 are shown as being separate from each other, the adjustment value management table T2 may be a part of the operation management table T1.

The ROM 23 is an example of a nonvolatile memory. The ROM 23 stores the management data and the firmware described above. Various management tables and the firmware stored in the ROM 23 are loaded on the RAM 22 and are used. In addition, a part of the management data that is loaded on the RAM 22 and is used may be stored in a storage (ROM area) 11a of the memory device 100 instead of the ROM 23. The storage 11a of the memory device 100, for example, is realized by one or more blocks BLK of a memory cell array 11 to be described later.

The memory interface 24 is physically connected to the memory device 100 through a NAND bus and transmits/receives signals in compliance with a NAND interface protocol. The NAND bus transmits signals in compliance with the NAND interface protocol. The signals in compliance with the NAND interface protocol, for example, include various control signals, input/output signals DQ, and ready/busy signals Ry/BYn. The input/output signals DQ, for example, have a width of eight bits and include a command (CMD), write data and read data (DATA), an address signal (ADD), and various kinds of management data. The ready/busy signal RY/BYn is independent for each memory device 100 and indicates that a memory device 100 transmitting a corresponding ready/busy signal Ry/BYn is in a ready state or a busy state, for example, in accordance with a high level or a low level. The memory device 100 receives an instruction from the memory controller 200 in the ready state but does not receive an instruction from the memory controller 200 in the busy state.

The ECC circuit 25 generates error correction code used for correcting an error in substantive data (payload data). The substantive data includes data instructed to be written by the host device 2 and management data. A set of substantive data and error correction code corresponding to the substantive data is written into the memory device 100 as write data. In addition, the ECC circuit 25 performs a calculation for data read from the memory device 100 and tries to acquire correct data (error-corrected data) included in read data (for example, the host read data, management data, or the like).

The general controller 26, for example, is realized by a part of the function of a processor and the RAM 22. The general controller 26 controls the host interface 21, the RAM 22, the ROM 23, the memory interface 24, and the ECC circuit 25. When writing or reading is performed, the general controller 26 performs the address mapping management described above and/or the management of the states of the memory device 100 while controlling the RAM 22 and the memory interface 24.

<1.1.3. Memory Device>

The memory device 100 includes elements such as a memory cell array 11, a sequencer (for example, control circuit) 12, an electric potential generating circuit 13, a driver 14, a row decoder 15, a sense amplifier 16, and the like.

The memory cell array 11 includes a plurality of blocks (memory blocks) BLK (BLK0, BLK1, . . . ). Each of the blocks BLK is a physical unit of the memory cell array 11, and data included in each of the blocks BLK is erased together. Each of the blocks BLK includes cell transistors MT (see FIG. 2). Each of the cell transistors MT stores write data supplied from the memory controller 200 in a nonvolatile manner.

The sequencer 12 controls elements such as the electric potential generating circuit 13, the driver 14, and the sense amplifier 16 on the basis of a command CMD. The sequencer 12 includes a register 121 and a timer 122. The register 121 includes a plurality of storage areas. Each of the storage areas may be specified using a unique address and may store one or a plurality of bits of information. The register 121 stores various kinds of data in each storage area.

The electric potential generating circuit 13 generates various electric potentials (voltages). The generated electric potentials are supplied to elements such as the driver 14 and the sense amplifier 16.

The driver 14 receives an address signal ADD and selects some electric potentials on the basis of the address signal ADD from among electric potentials supplied from the electric potential generating circuit 13 and supplies the selected electric potentials to the row decoder 15.

The row decoder 15 receives an address signal ADD and selects one block BLK on the basis of the address signal ADD. The row decoder 15 transmits the electric potentials supplied from the driver 14 to the selected block BLK.

The sense amplifier 16 is a circuit used for amplifying currents from the cell transistors MT. The sense amplifier 16 senses the states (the threshold voltages, specifically) of cell transistors MT and generates read data on the basis of the sensed states. In addition, the sense amplifier 16 transmits write data to the cell transistors MT. Here, a method used for the sense amplifier 16 to sense the states of the cell transistors MT is not limited to a specific method and may be a method other than a method amplifying currents.

<1.1.3.1. Cell Array>

Figure 2:
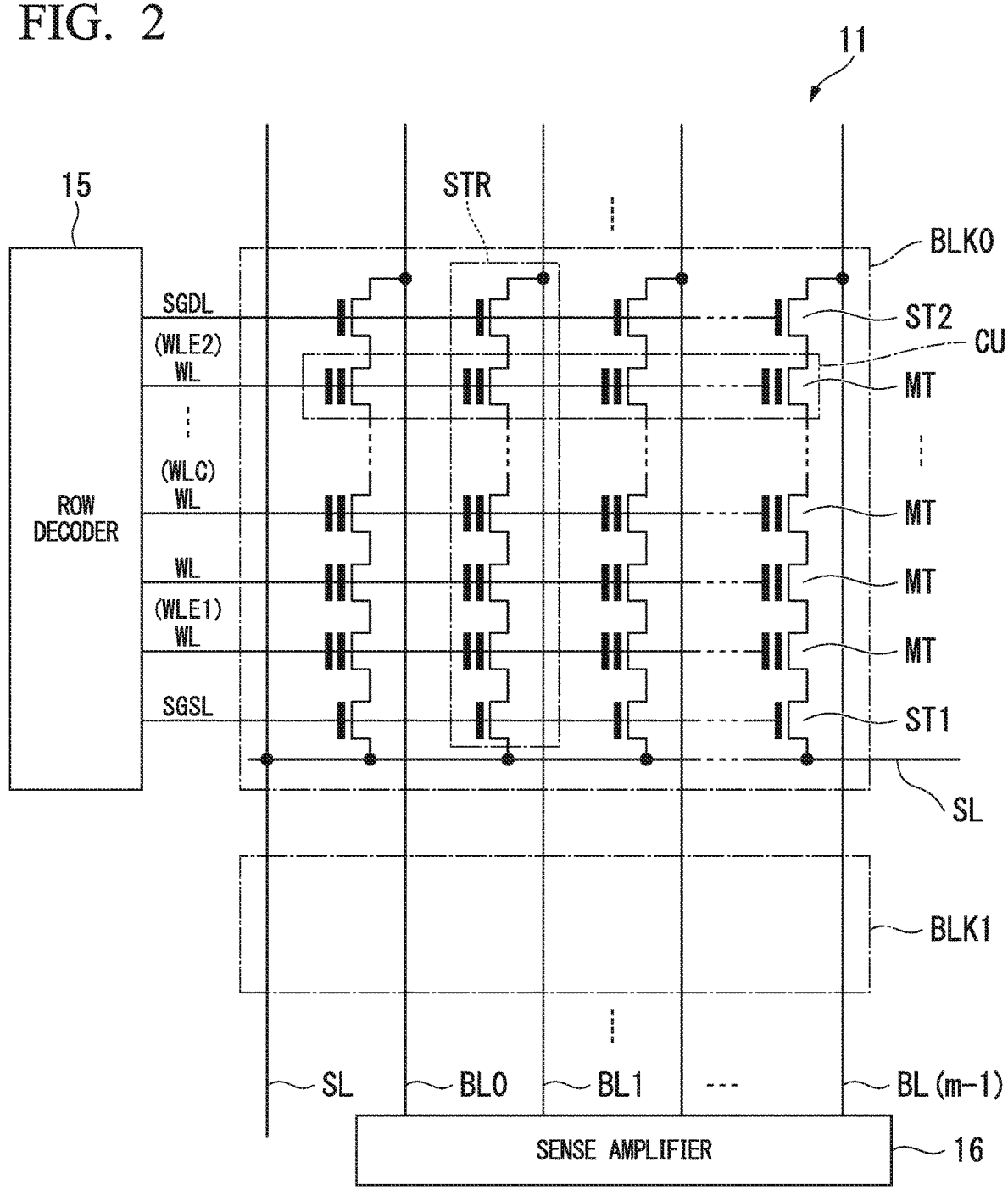
FIG. 2 is a block diagram showing a configuration of a part of a memory cell array according to the first embodiment.

FIG. 2 shows an example of some elements and connections of the memory cell array 11 according to the first embodiment and is a diagram showing the elements and connections of a block BLK0 and related elements. Each of a plurality of (for example, all) blocks BLK of the memory cell array 11 includes elements and connections shown in FIG. 2. The memory device 100 according to the first embodiment is, for example, a memory device 100 (a two-dimensional NAND memory) in which a plurality of word lines WL are arranged on a plane.

As shown in FIG. 2, each of m (here, m is a natural number) bit lines BL0 to BL(m−1) is connected to one string STR in each block BLK. Each string STR includes one first selection gate transistor ST1, a plurality of cell transistors MT, and one second selection gate transistor ST2. The first selection gate transistor ST1, the plurality of cell transistors MT, and the second selection gate transistor ST2 are connected in series between a source line SL and one bit line BL in this order.

A control gate electrode of the first selection gate transistor ST1 is connected to a first selection gate line (source-side selection gate line) SGSL. The first selection gate line SGSL is a control signal line controlling the control gate electrode of the first selection gate transistor ST1. The first selection gate transistor ST1 selectively connects a plurality of cell transistors MT and the source line SL on the basis of a voltage applied through the first selection gate line SGSL.

A control gate electrode of the second selection gate transistor ST2 is connected to a second selection gate line (drain-side selection gate line) SGDL. The second selection gate line SGDL is a control signal line controlling the control gate electrode of the second selection gate transistor ST2. The second selection gate transistor ST2 selectively connects a plurality of cell transistors MT and the bit line BL on the basis of a voltage applied through the second selection gate line SGDL.

Each cell transistor MT includes a control gate electrode and an electric charge accumulation layer insulated from the surroundings and holds data on the basis of the amount of electric charge inside the electric charge accumulation layer. In the cell transistor MT, electrons are injected into the electric charge accumulation layer in accordance with writing data, and electrons are pulled out from the electric charge accumulation layer for erasing data.

In each block BLK, the control gate electrodes of the cell transistors MT are connected to word lines WL. The word lines WL are control signal lines used for selecting one group of the cell transistors MT arranged in one row of the memory cell array 11. The cell transistors MT are disposed at intersection portions of the word lines WL and the bit lines BL (BL0 to BL(m−1)). By applying a predetermined voltage to the word line WL (hereinafter, may be referred to as a "selected word line WL") connected to the cell transistor that is a target of reading or writing data, data can be read/written from/into the cell transistor MT.

In each block BLK, one word line WL corresponding to one address is connected to be common to a plurality of cell transistors MT included in different strings STR. A set of the cell transistors MT sharing the one word line WL is referred to as a cell unit CU. For a plurality of cell transistors MT included in one cell unit CU, data is written collectively, and data is read collectively. A storage space of one cell unit CU includes one or a plurality of pages.

<1.1.3.2. Physical Structure of Cell Array>

Figure 3:
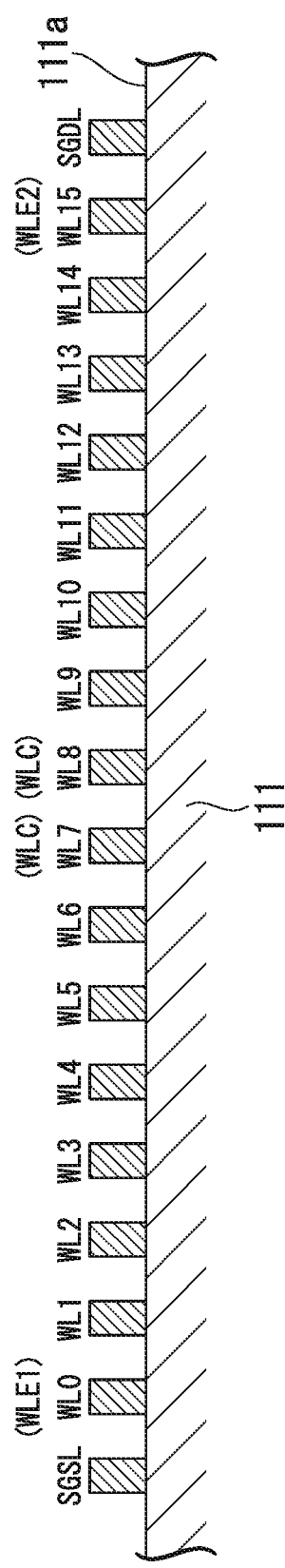
FIG. 3 is a cross-sectional view showing a structure of a part of the memory cell array according to the first embodiment.

FIG. 3 is a cross-sectional view showing the physical structure of some elements of the memory cell array 11 according to the first embodiment. As shown in FIG. 3, the memory cell array 11 includes a semiconductor substrate 111, the plurality of word lines WL (WL0 to WL15), the first selection gate line SGSL, and the second selection gate line SGDL. In FIG. 3, while an example in which 16 word lines WL are arranged is shown, the number of the word lines WL is not limited to that of this example.

The semiconductor substrate 111 is an example of a "substrate". The semiconductor substrate 111 is an element forming a base on which the plurality of word lines WL, the first selection gate line SGSL, and the second selection gate line SGDL are provided. The semiconductor substrate 111 may be referred to a "base", a "supporter", or the like. The semiconductor substrate 111 includes a base surface 111a spreading in a planar shape. The "planar shape" in this application includes a case where unevenness of some degree is present.

The plurality of word lines WL, the first selection gate line SGSL, and the second selection gate line SGDL are arranged in a direction that is substantially parallel to the base surface 111a of the semiconductor substrate 111. The plurality of word lines WL, the first selection gate line SGSL, and the second selection gate line SGDL extend substantially parallel to each other. The plurality of the word lines WL are located between the first selection gate line SGSL and the second selection gate line SGDL. The plurality of word lines WL described here is a plurality of word lines connected to a plurality of cell transistors MT included in the same string STR. In other words, the "plurality of word lines WL" described here is a plurality of word lines connected to a plurality of cell transistors MT that are electrically connected in series.

In addition, a first dummy line may be provided between the plurality of word lines WL and the first selection gate line SGSL. Similarly, a second dummy line may be provided between the plurality of word lines WL and the second selection gate line SGDL. The first dummy line and the second dummy line represent conductive lines that are not connected to transistors serving as the cell transistors MT. The first dummy line and the second dummy line serve as buffers between the plurality of word lines WL and the selection gate lines SGSL and SGDL so that the interference from voltages applied to the first selection gate line SGSL and the second selection gate line SGDL to the word lines WL is mitigated.

In the first embodiment, the plurality of word lines WL include a first-end word line WLE1, a second-end word line WLE2, and center word lines WLC. The first-end word line WLE1 is a word line WL located at a first end (a first-side end) among the plurality of word lines WL. For example, the first-end word line WLE1 is a word line WL closest to the first selection gate line SGSL among the plurality of word lines WL. In the example shown in FIG. 3, a word line WL0 corresponds to the first-end word line WLE1.

Similarly, the second-end word line WLE2 is a word line WL located at a second end (a second-side end) among the plurality of word lines WL. The second side is opposite to the first side. For example, the second-end word line WLE2 is a word line WL closest to the second selection gate line SGDL among the plurality of word lines WL. In the example shown in FIG. 3, a word line WL15 corresponds to the second-end word line WLE2.

For example, the center word lines WLC are word lines having the smallest difference between the distance from the first-end word line WLE1 and the distance from the second-end word line WLE2 among the plurality of word lines WL. Here, the term "center" is used for the convenience of description. For this reason, the center word lines WLC may not be necessarily located at an equal distance from the first-end word line WLE1 and the second-end word line WLE2. In the example shown in FIG. 3, a word line WL7 and a word line WL8 correspond to the center word lines WLC. From one viewpoint, the center word lines WLC are word lines WL located between the first-end word line WLE1 and the second-end word line WLE2.

In the first embodiment, the first-end word line WLE1 is an example of a "first word line". In addition, a cell transistor MT connected to the first-end word line WLE1 is an example of a "first cell transistor". On the other hand, the center word line WLC is an example of a "second word line". In addition, a cell transistor MT connected to the center word line WLC is an example of a "second cell transistor".

However, the "first word line" and the "second word line" are not limited to the examples described above. For example, the "first word line" may be the second-end word line WLE2. In addition, the "first word line" may be a word line other than the word lines WL (for example, the first-end word line WLE1 and the second-end word line WLE2) located at the ends among the plurality of word lines WL. Furthermore, the first-end word line WLE1 may be the "first word line", and the second-end word line WLE2 may be the "second word line".

<1.1.3.2 Cell Transistor>

Figure 4:
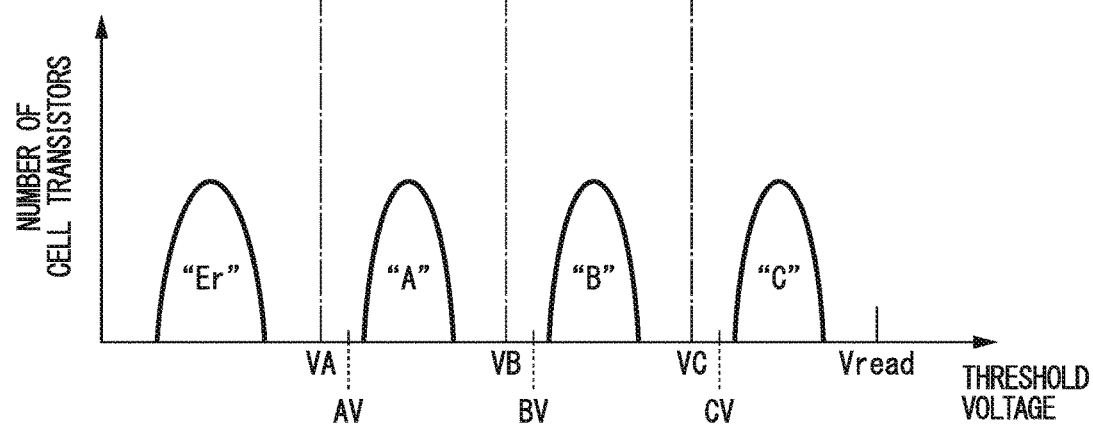
FIG. 4 is a diagram showing threshold voltage distribution of cell transistors according to the first embodiment.

In the memory device 100, data of one bit or more may be held in one cell transistor MT. FIG. 4 is a diagram showing distribution of threshold voltages of cell transistors MT that are configured to hold data of two bits per one cell transistor MT as a result of writing. A threshold voltage of each cell transistor MT corresponds to a data value (state) that corresponds to two-bit data held therein. Each cell transistor MT may have any one of four states (i.e., lobes or ranges of threshold voltages).

There may be a variation in threshold voltages of a plurality of cell transistors MT storing the same two-bit data. For this reason, the threshold voltages of a plurality of cell transistors MT storing the same data form a lobe of distribution. The cell transistors MT belonging to four lobes are at a state Er, a state A, a state B, and a state C in order from low to high in voltage among four states. For example, the state Er, the state A, the state B, and the state C are handled as states storing data "11", data "01", data "00", and data "10". The state Er corresponds to an erased state. Usually, data is written (programmed) into a cell transistor MT that is in the erased state. Here, the data "01" is an example of a "first data value". The data "00" is an example of a "second data value". The data "10" is an example of a "third data value". A term "data value" in this application means the value of data stored in the cell transistor MT. The "first data value", the "second data value", and the "third data value" have different ranges of threshold voltages from each other.

As shown in FIG. 4, the threshold voltages of the cell transistors MT of the state A, the state B, and the state C are respectively higher than the threshold voltages of the cell transistors MT of the state Er, the state A, and the state B. The cell transistor MT having a threshold voltage lower than a read voltage VA is determined to be at the state Er. The cell transistor MT having a threshold voltage equal to or higher than the read voltage VA and lower than a read voltage VB is determined to be in the state A. The cell transistor MT having a threshold voltage equal to or higher than the read voltage VB and lower than a read voltage VC is determined to be in the state B. The cell transistor MT having a threshold voltage equal to or higher than the read voltage VC is determined to be in the state C. Each of the read voltages VA, VB, and VC may be referred to as a read voltage Vcgr. A voltage Vread is a voltage applied to the control gate electrode of the cell transistor MT of a non-reading target word line WL. The voltage Vread is higher than the threshold voltages of any cell transistor MT.

In a case where data of a plurality of bits is stored per one cell transistor MT, a set of data bits in a same order out of two bits stored in the cell transistors MT of one cell unit CU forms one page. More specifically, a set of high-order bits forms an upper page, and a set of low-order bits forms a lower page.

In order to check (verify) the completion of writing, verify voltages AV, BV, and CV are used. Here, the term "verify" means checking whether writing (programming) the cell transistor MT to a target state (data value) has been completed. Specifically, while the verify voltages AV, BV, or CV is applied to a word line (selected word line) WL connected to a writing target cell transistor MT, when the cell transistor (selected cell transistor) MT for which data is to be written into the state A, the state B, or the state C respectively has a threshold voltage that is equal to or higher than the verify voltages AV, BV, or CV, the writing of data into the cell transistor MT into the desired state is determined to have been completed. More specifically, in a verify operation, a voltage Vread is applied to a non-selected word line WL (non-selected cell transistor MT), and a verify voltage is applied to the selected word line WL. As a result, in a case where a predetermined cell current does not flow, the writing of data into the selected cell transistor MT is determined to have been completed. The verify voltages BV and CV are respectively higher than the verify voltages AV and BV. Each of the verify voltages AV, BV, and CV may be referred to as a verify voltage Vvf.

Data of three bits or more may be stored in one cell transistor MT by extending the principle described above. In addition, in a case where data of one bit per one cell transistor MT is stored, any two states shown in FIG. 4 are used.

<1.2. Operation>
<1.2.1. Operation of Writing Data into Cell Transistor>

Next, an operation of writing (programming) data into the cell transistors MT will be described.

Figure 5:
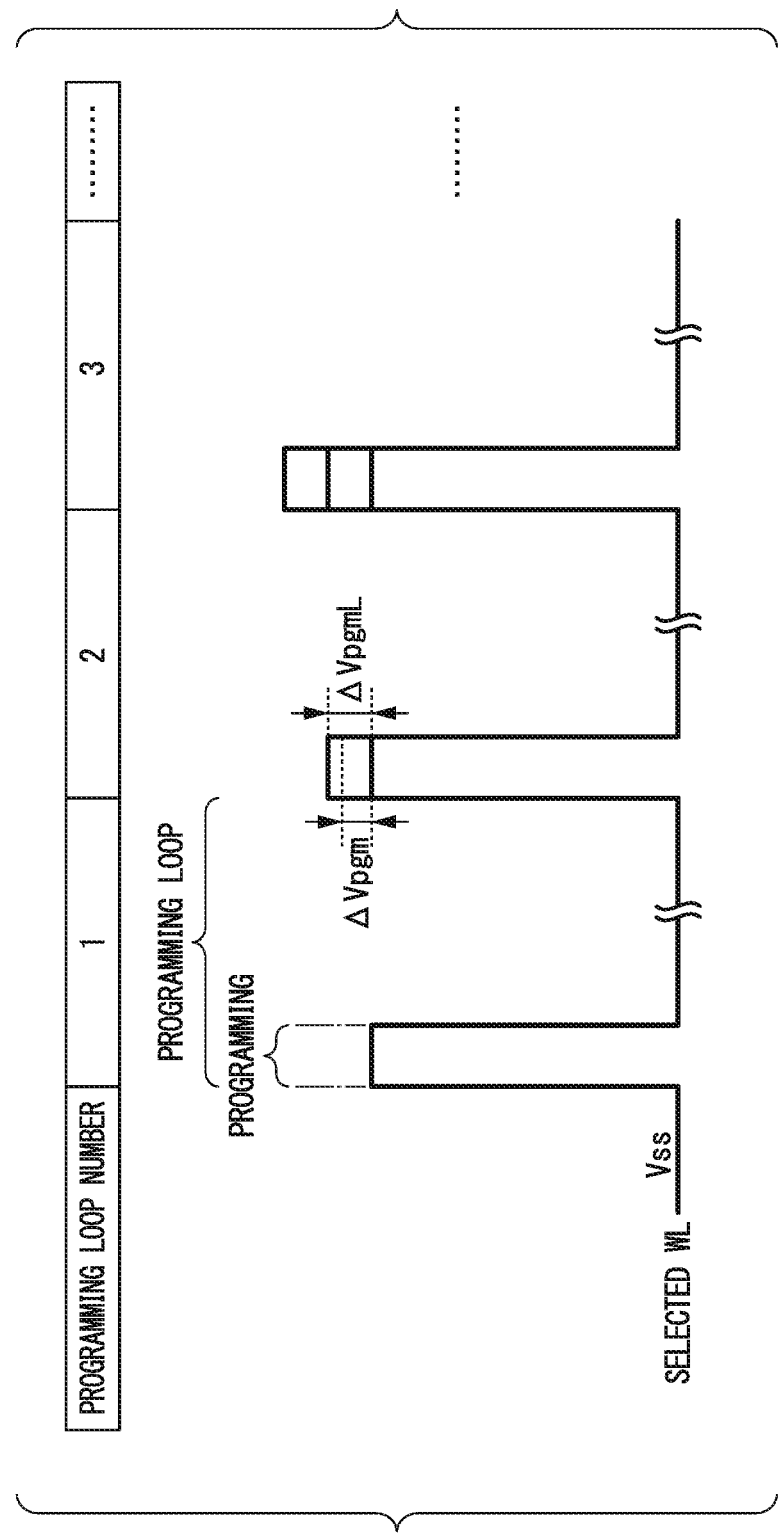
FIG. 5 is a diagram showing examples of voltages that are applied to a selected word line according to the first embodiment.

FIG. 5 is a diagram showing voltages applied to the selected word line WL in a writing operation for the memory device 100 with respect to time. As shown in FIG. 5, the writing operation includes a plurality of programming loops. Each programming loop includes programming and other stages (a verify stage, a stage of counting cell transistors MT incompletely programmed, and the like). Here, the programming means an operation of applying a programming voltage Vpgm to the selected word line WL so as to have the threshold voltage corresponding to a data value to be written into the selected cell transistor MT.

Here, in the programming of a p-th programming loop (here, p is a natural number), a programming voltage Vpgm applied to the selected word line WL is set to be higher than a programming voltage Vpgm applied to the selected word line WL in the programming of a preceding (p−1)-th programming loop, for example, by an increment ΔVpgm (or an increment ΔVpgmL to be described later). By repeatedly executing such programming loops, the voltage applied to the selected word line WL becomes higher gradually (by the increment ΔVpgm (or ΔVpgmL) each time). In a verify stage included in each programming loop, it is determined whether or not the writing of a desired data value into the selected cell transistor MT has been completed. In the verify stage, in a case where the writing of the desired data value into the selected cell transistor MT is determined to have been completed, in the subsequent programming loops, a writing operation is controlled such that the programming voltage Vpgm is not applied.

The increment ΔVpgm is a default value (reference value) for the increment. In other words, the default increment ΔVpgm is a value used in the initial state (a state in which the value has not changed) of the memory device 100. The increment ΔVpgm, for example, is registered in the operation management table T1 and may be referred to (i.e., may be acquired) by the memory controller 200.

In the first embodiment, as another setting value of the increment, an increment ΔVpgmL is registered in the operation management table T1. This increment ΔVpgmL is larger than the increment ΔVpgm. The memory controller 200 may acquire the increment ΔVpgmL by referring to the operation management table T1. The memory controller 200 may instruct the memory device 100 to increase a voltage applied to the selected word line WL for each programming loop by the increment ΔVpgmL instead of the increment ΔVpgm. By increasing the voltage applied to the selected word line WL by the increment ΔVpgmL larger than the increment ΔVpgm, the writing speed can be increased.

In addition, an increase in the writing speed may be achieved by increasing an initial value of the programming voltage Vpgm instead of or in addition to using the large increment ΔVpgmL. The "initial value of the programming voltage Vpgm" is a voltage applied to the selected word line WL in a first programming loop. In such a case, the controller 200 may instruct an initial value (or an adjustment value to the default value of the initial value of the programming voltage Vpgm) of the programming voltage Vpgm set to be higher in advance to the memory device 100 instead of the default value of the initial value of the programming voltage Vpgm. The initial value (or the adjustment value for the default value of the initial value of the programming voltage Vpgm) of the programming voltage Vpgm set to be high in advance, for example, is registered in the operation management table T1. In the first embodiment described below, an example will be representatively described in which the larger increment ΔVpgmL is used for increasing the writing speed. In such description, the use of the larger increment ΔVpgmL may be replaced by setting the initial value of the programming voltage Vpgm to be higher.

The increment ΔVpgmL is instructed to be used by, for example, an adjustment instruction (a set command/instruction) preceding a write instruction by the memory controller 200. In addition, as the adjustment instruction, the value of the increment ΔVpgmL (or a difference between the increment ΔVpgm and the increment ΔVpgmL) may be designated. For example, the memory controller 200 instructs the use of the increment ΔVpgmL in most of writing operations for the memory device 100. For example, the memory controller 200 may instruct the use of the increment ΔVpgmL in all the writing operations for the memory device 100. The following description is based on an example in which the increment ΔVpgmL is used for all writing operation.

<1.2.2. Adjustment of Verify Voltage>

Next, the adjustment of the verify voltage Vvf will be described.

As described above, for example, in a case where writing is performed using the increment ΔVpgmL larger than the increment ΔVpgm, there are cases where the width of the threshold voltage distribution of the cell transistors MT for each data value becomes larger, and the number of error bits upon reading becomes larger. Here, there is a variation in the degree of easiness in writing data into the cell transistors MT, for example, on the basis of the physical locations of the word lines WL. Therefore, in the memory system 1 according to the first embodiment 1, by adjusting the verify voltage Vvf for each word line WL on the basis of the physical location of the word line WL, an increase in the width of the threshold voltage distribution of the cell transistors MT is suppressed.

In the first embodiment, the default value (common reference value) of the verify voltage Vvf is registered in the operation management table T1. The default value of the verify voltage Vvf is a value used in the initial state (a state in which the value has not changed) of the memory device 100. In the initial state, the default value of the verify voltage Vvf is set to be common (the same value is set) to a plurality of word lines WL (for example, a plurality of word lines WL of the same string STR).

For example, a plurality of default values of the verify voltages Vvf may be set in correspondence with a plurality of degrees of wear of the memory device 100. The default values of the verify voltages Vvf may be stored in the storage 11a of the memory device 100 and be used by being read into the register 121 of the sequencer 12 instead of being registered in the operation management table T1.

The default values of the verify voltages Vvf include values representing the verify voltages AV, BV, and CV respectively corresponding to the state A, the state B, and the state C that are the data storage states of the cell transistor MT described above. In other words, the default values of the verify voltages Vvf include a default value (first common reference value) of the verify voltage AV, a default value (second common reference value) of the verify voltage BY, and a default value (third common reference value) of the verify voltage CV. The default value of the verify voltage AV is set to be common to a plurality of word lines WL. Similarly, the default value of the verify voltage BV is set to be common to the plurality of word lines WI. The default value of the verify voltage CV is set to be common to the plurality of word lines WL.

The memory controller 200 may acquire the default values of the verify voltages by referring to the operation management table T1. The memory controller 200 instructs the default values of the verify voltages Vvf to a selected memory device 100 proceeding the instruction for using the adjustment values ΔDAC of the verify voltages Vvf to be described later. For example, the memory controller 200 instructs the default values of the verify voltages Vvf to the selected memory device 100 by using an adjustment instruction proceeding a write instruction. In addition, as described above, the default values of the verify voltages Vvf may be read into the register 121 of the sequencer 12 from the storage 11a of the memory device 100 and be used instead of being instructed by the memory controller 200.

Figure 6:
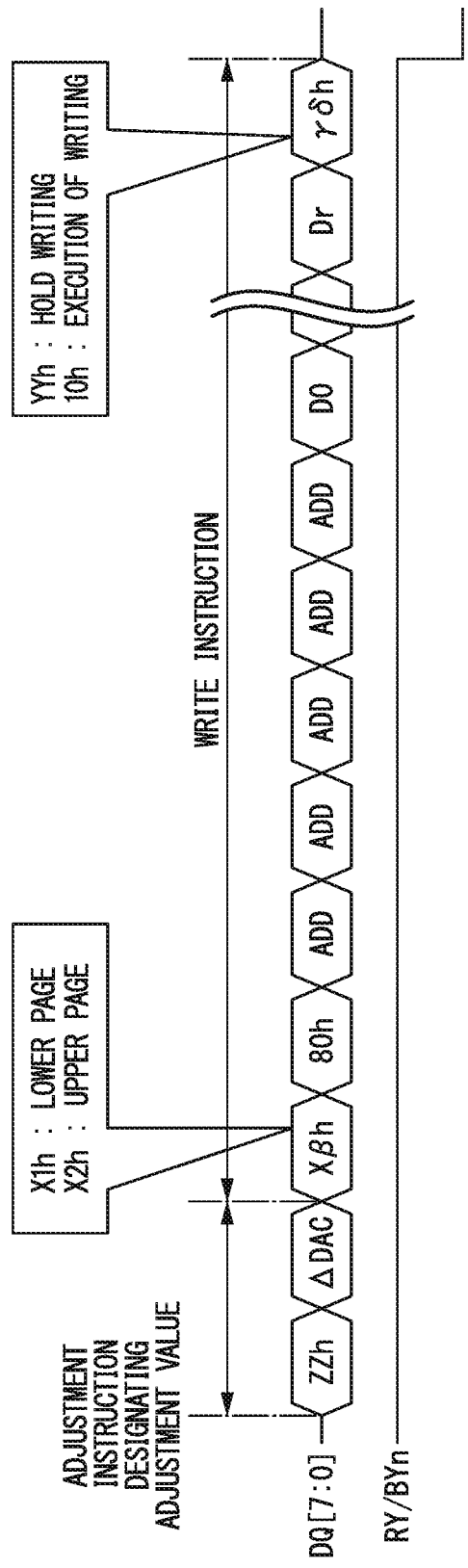
FIG. 6 is a diagram showing an example of a signal transmitted to a selected memory device according to the first embodiment.

FIG. 6 shows a signal transmitted for writing from the memory controller 200 to the selected memory device 100 with respect to time in the first embodiment. As shown in FIG. 6, the memory controller 200 transmits an adjustment instruction designating adjustment values relating to the verify voltages Vvf. The adjustment instruction includes a command ZZh and a signal representing an adjustment value ΔDAC. The command ZZh instructs to use values different from the default values for the verify voltages Vvf in writing according to a subsequent write instruction. The adjustment value ΔDAC represents an adjustment value (an adjustment value ΔVvf to be described later) for the default value of the verify voltage Vvf.

The memory controller 200 transmits a write instruction following the signal representing the adjustment value ΔDAC. The write instruction includes: a command Xβh (here, β is 1 or 2); a command 80h; an address signal ADD; write data D0 to Dr (here, r is a natural number); and a command γδh (here, γδ is YY or 10). The command Xβh designates a writing target page, and β is different on the basis of the writing target page. For example, in order to designate that writing target is a lower page or an upper page, commands X1h and X2h are respectively transmitted. In addition, in the case of storing one bit per one cell transistor MT, the command Xβh is not transmitted.

The command γδh instructs the holding or execution of writing. Data of two pages is collectively written into a writing target cell unit CU. For this reason, in a case where data of two pages is not transmitted yet to the selected memory device 100, in order to instruct the holding of writing, a command YYh is transmitted as the command γδh. On the other hand, in a case where data of two pages is transmitted to the memory device 100, in order to instruct the execution of writing, a command 10h is transmitted as the command γδh. In addition, in the cell unit CU, writing data into the lower page and writing data into the upper page may be performed in a separate manner.

Figure 7:
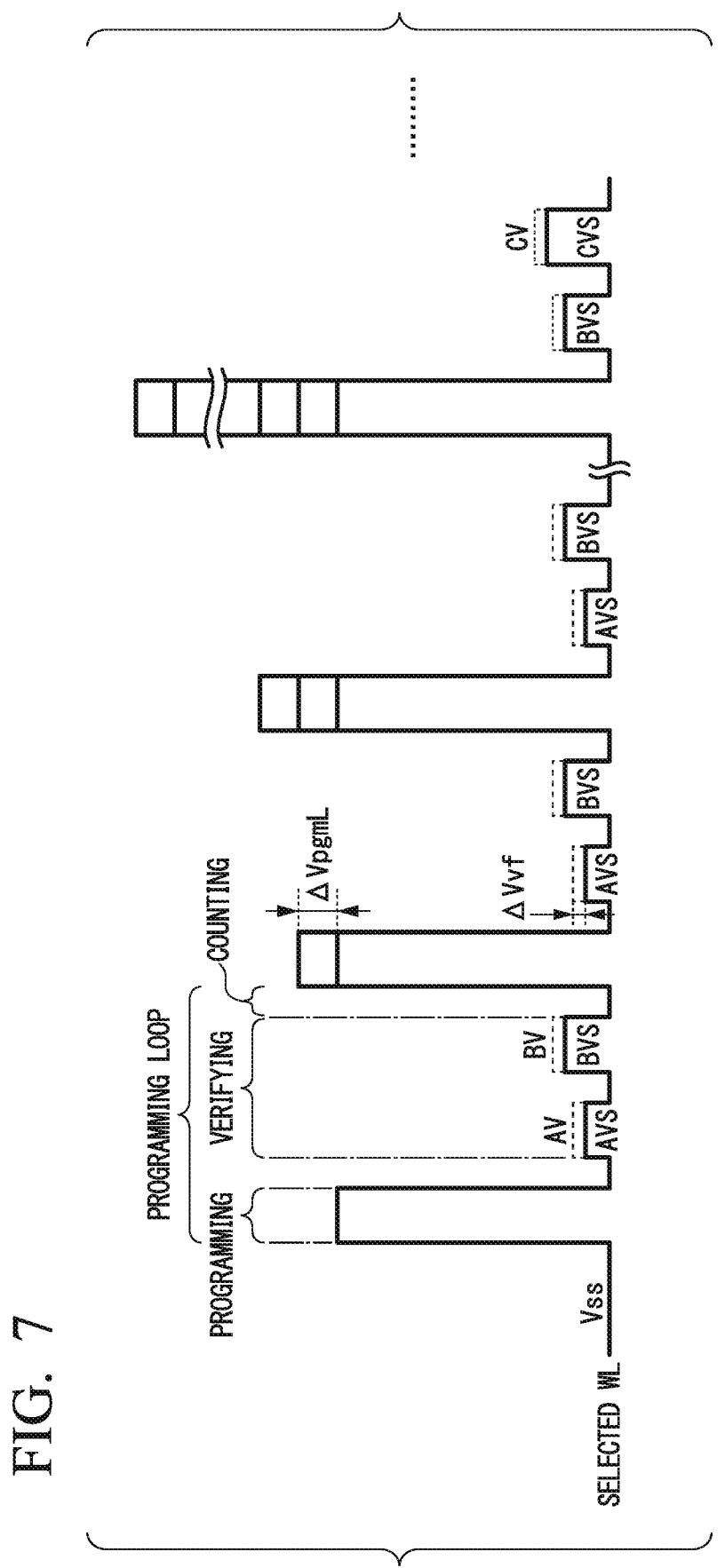
FIG. 7 is a diagram showing examples of voltages that are applied to the selected word line according to the first embodiment.

FIG. 7 shows writing using the write instruction following the adjustment instruction and shows voltages applied to the selected word line WL in such writing with respect to time. As shown in FIG. 7, a verify stage includes verification for one or a plurality of the state A, the state B, and the state C in accordance with a programming loop number for the verification. For example, when the programming loop number is small, there is no cell transistor MT of which the threshold voltage rises up to the state C, and accordingly, verification for the state A and the state B is performed. On the other hand, while the programming loop number is large, the cell transistor MT of which data is written in the state A passes through verification, and accordingly, verification for the state A is not performed.

Here, in a case where verification is performed using the default value of the verify voltage Vvf, the verify voltages AV, BV, and CV are respectively applied to the selected word line WL during verification for the state A, verification for the state B, and verification for the state C. In the first embodiment, the adjustment command ZZh instructs using a value acquired by lowering the default value of the verify voltage Vvf by the adjustment value ΔVvf for verification. In other words, in the first embodiment, by using the default value of the verify voltage Vvf and the adjustment value ΔVvf for the default value, the verify voltages AVS, BVS, and CVS are respectively applied to the selected word line WL during the verification for the state A, the verification for the state B, and the verification for the state C. The verify voltages AVS, BVS, and CVS are respectively lower than the default verify voltages AV, BY, and CV.

For example, each of a difference between the verify voltage AVS and the verify voltage AV, a difference between the verify voltage BVS and the verify voltage BV, and a difference between the verify voltage CVS and the verify voltage CV is the adjustment value ΔVvf. The difference between the verify voltage AVS and the verify voltage AV, the difference between the verify voltage BVS and the verify voltage BV, and the difference between the verify voltage CVS and the verify voltage CV may be different from each other. A case where the difference between the verify voltage AVS and the verify voltage AV, the difference between the verify voltage BVS and the verify voltage BV, and the difference between the verify voltage CVS and the verify voltage CV are different from each other will be described later with reference to FIG. 10.

Here, as described above, there is a variation in the degree of easiness in writing data into the cell transistors MT, for example, on the basis of the physical locations of the word lines WL. Therefore, in the first embodiment, the adjustment value ΔVvf for the verify voltage Vvf is set according to the physical location of the word line WL. In the first embodiment, the adjustment value ΔVvf for the verify voltage is individually set to each of a plurality of word lines WL. In other words, for a different selected word line WL, ΔVvf of a different value is used.

Figure 8:
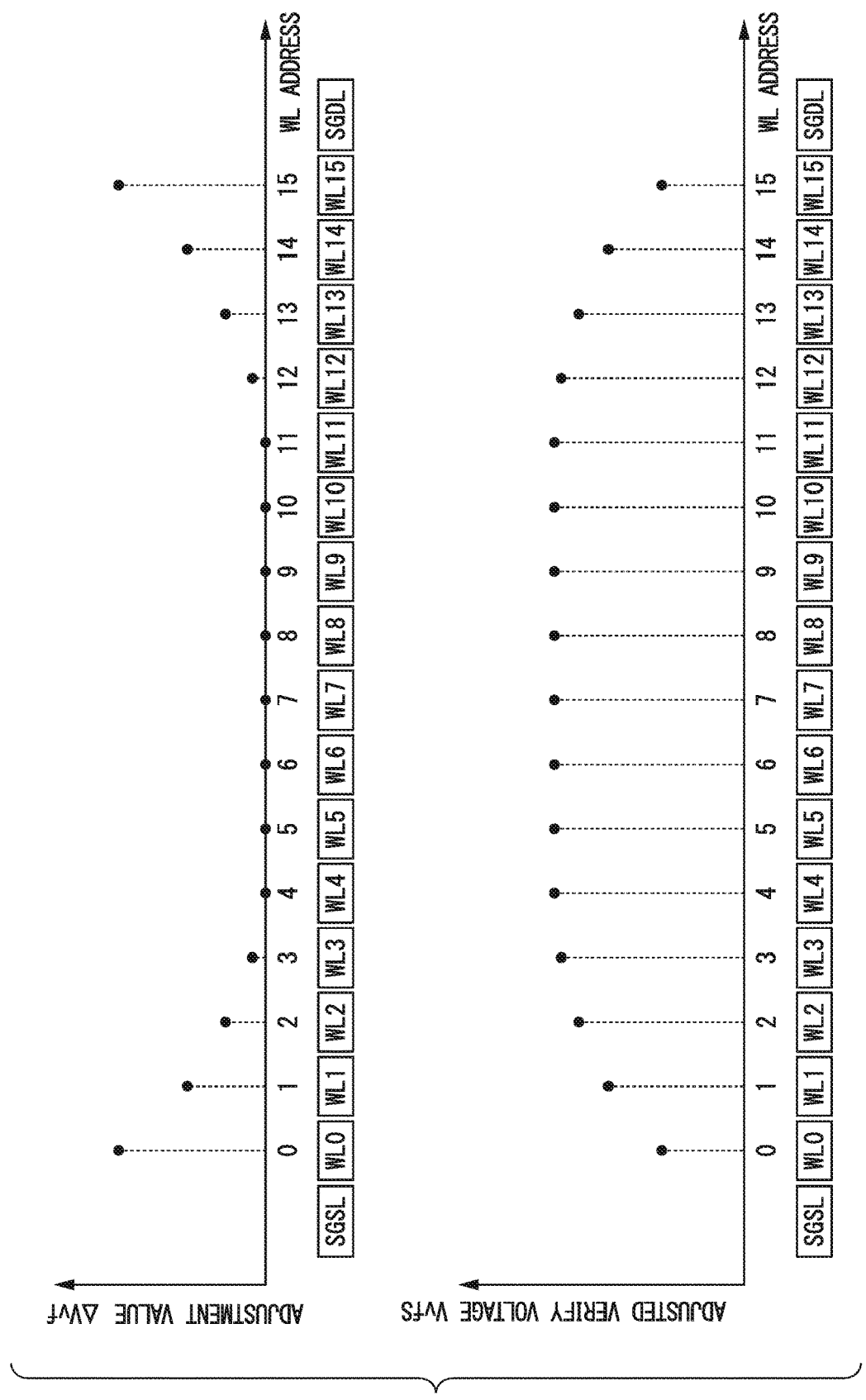
FIG. 8 is a diagram showing adjustment values for a plurality of word lines according to the first embodiment.

FIG. 8 shows addresses of a plurality of word lines WL located between the first selection gate line SGSL and the second selection gate line SGDL and adjustment values ΔVvf that are individually set to the word lines WL. FIG. 8 shows a case where 16 cell transistors MT are included in one string STR and shows an example for 16 word lines WL connected to the 16 cell transistors MT. Hereinafter, names of adjustment values ΔVvf0 to ΔVvf15 respectively corresponding to the word lines WL0 to WL15 will be used. In the first embodiment, for example, the word lines WL0 to WL15 are arranged in a direction of moving away from the first selection gate line SGSL as the value of N of the word line WLN (here, N is a natural number) increases. Here, the method for assigning the addresses (word lines WL0 to WL15) to the word lines WL is not limited to that of the example described above. Thus, the addresses may be assigned in the reverse order (order in which the word lines are arranged such that a word line approaches the first selection gate line SGSL as the value of N of the word line WLN (here, N is a natural number) increases).

As shown in FIG. 8, the values (for example, absolute values) of adjustment values ΔVvf0 and ΔVvf15 for the word lines WL0 and WL15 (the first-end word line WLE1 and the second-end word line WLE2 described above) of both ends of the plurality of word lines WL are the maximum among the adjustment values ΔVvf0 to ΔVvf15. On the other hand, the values (for example, absolute values) of adjustment values ΔVvf7 and ΔVvf8 for the word lines WL7 and WL8 (the center word lines WLC described above) of the center of the plurality of word lines WL are the minimum among the adjustment values ΔVvf0 to ΔVvf15 and, for example, are zero.

In the first embodiment, adjustment values ΔVvf1, ΔVvf2, and ΔVvf3 for a plurality of word lines WL1, WL2, and WL3 which are close to the word line WL0 (the first-end word line WLE1) have positive values. The adjustment values ΔVvf1, ΔVvf2, and ΔVvf3 may be negative values or may be a combination of positive values and negative values. In the first embodiment (for example, a case where the adjustment values ΔVvf are not a combination of positive values and negative values), the values (for example, absolute values) of the adjustment values ΔVvf0, ΔVvf1, ΔVvf2, and ΔVvf3 decrease as the value of N of ΔVvfN (here, N is a natural number) increases. Similarly; adjustment values ΔVvf14, ΔVvf13, and ΔVvf12 for a plurality of word lines WL14, WL13, and WL12 which are close to the word line WL15 (the second-end word line WLE2) have positive values. The adjustment values ΔVvf14, ΔVvf13, and ΔVvf12 may be negative values or may be a combination of positive values and negative values. In the first embodiment, the values (for example, absolute values) of the adjustment values ΔVvf15, ΔVvf14, ΔVvf13, and ΔVvf12 decrease as the value of N of ΔVvfN (here, N is a natural number) decreases. Meanwhile, the adjustment values ΔVvf4, ΔVvf5, ΔVvf6, ΔVvf7, ΔVvf8, ΔVvf9, ΔVvf10, and ΔVvf11 for the word lines WL4, WL5, WL6, WL7, WL8, WL9, WH10, and WL11, for example, are zero.

In a case where the adjustment values ΔVvf as above are set, the verify voltages Vvf0 and Vvf15 applied to the word lines WL0 and WL15 (the first-end word line WLE1 and the second-end word line WLE2) of both ends are minimum among the verify voltages Vvf0 to Vvf15 as the verify voltages VvfS after the adjustment. On the other hand, the verify voltages Vvf7 and Vvf8 applied to the word lines WL7 and WL8 (the center word lines WLC described above) of the center are maximum among the verify voltages Vvf0 to Vvf15 as the verify voltages VvfS after the adjustment.

In the first embodiment, as the verify voltages VvfS after the adjustment, the verify voltages Vvf1, Vvf2, and Vvf3 applied to a plurality of word lines WL1, WL2, and WL3 which are close to the word line WL0 (the first-end word line WLE1) are lower than the verify voltages Vvf7 and Vvf8 applied to the center word lines WL7 and WL8. For example, the verify voltages Vvf3, Vvf2, Vvf1, and Vvf0 that are verify voltages VvfS after the adjustment are lower as the value of N of VvfN (here, N is a natural number) is smaller. Similarly, as the verify voltages VvfS after the adjustment, the verify voltages Vvf14, Vvf13, and Vvf12 applied to the plurality of word lines WL14, WL13, and WL12 which are close to the word line WL15 (the second-end word line WLE2) are lower than the verify voltages Vvf7 and Vvf8 applied to the center word lines WL7 and WL8. For example, the verify voltages Vvf12, Vvf13, Vvf14, and Vvf15 that are verify voltages VvfS after the adjustment are lower as the value of N of VvfN (here, N is a natural number) is larger. On the other hand, the verify voltages Vvf4, Vvf5, Vvf6, Vvf7, Vvf8, Vvf9, Vvf10, and Vvf11 applied to the word lines WL4, WL5, WL6, WL7, WL8, WL9, WL10, and WL11 as the verify voltages VvfS after the adjustment, for example, may be the same.

The adjustment values ΔVvf shown in FIG. 8 are an example. For example, instead of the example shown in FIG. 8, the adjustment values ΔVvf2, ΔVvf3, ΔVvf13, ΔVvf12, and the like may be zero. In addition, instead of the example shown in FIG. 8, one or more of the adjustment values ΔVvf4 to ΔVvf11 may be not zero and have a positive value.

In addition, this similarly applies also to a case where one string STR corresponds to more or less word lines than the 16 word lines WL described above. In other words, the adjustment value ΔVvf for the word lines WL of both ends of the plurality of word line WL has a maximum value (for example, a maximum absolute value), and the adjustment value ΔVvf for the center word lines WL has a minimum value (for example, the minimum absolute value). In addition, among a plurality of word lines WL which are close to the end-most word lines WL, the value (for example, the absolute value) of the adjustment value ΔVvf for a word line closer to the end is larger.

In the first embodiment, the adjustment value ΔVvf corresponding to each word line WL set as described above is registered in the adjustment value management table T2 in association with the corresponding word line WL. The memory controller 200 may acquire the adjustment value ΔVvf corresponding to each word line WL by referring to the adjustment value management table T2.

FIG. 9 is a diagram showing an example of a content of the adjustment value management table T2.

As shown in FIG. 9, in the adjustment value management table T2, the adjustment values ΔVvf (ΔVvf0 to ΔVvf15) corresponding to the plurality of word lines WL are respectively managed in association with the word lines WL (WL0 to WL15).

In the example shown in FIG. 9, one adjustment value ΔVvf is set to each word line WL. The memory controller 200 adjusts each of the verify voltages AV, BV, and CV by using one adjustment value ΔVvf (one of ΔVvf0 to ΔVvf15) set to each word line WL. In this case, the adjustment values are the same among the verify voltages AV, BV, and CV.

In other words, in this case, the adjusted verify voltage AVS applied to each word line WL is obtained on the basis of the default value (first common reference value) of the verify voltage AV and the adjustment value ΔVvf (one of ΔVvf0 to ΔVvf15) set to each word line WL. Similarly, the adjusted verify voltage BVS applied to each word line WL is obtained on the basis of the default value (second common reference value) of the verify voltage BV and the adjustment value ΔVvf (one of ΔVvf0 to ΔVvf15) set to each word line WL. The adjusted verify voltage CVS applied to each word line WL is obtained on the basis of the default value (third common reference value) of the verify voltage CV and the adjustment value ΔVvf (one of ΔVvf0 to ΔVvf15) set to each word line WL.

In this case, the adjustment value ΔVvf0 is one example of a "first adjustment value". The adjustment value ΔVvf7 is one example of a "second adjustment value". In addition, the verify voltage AVS adjusted on the basis of the default value of the verify voltage AV and the adjustment value ΔVvf0 is one example of a "first verify voltage". The verify voltage AVS adjusted on the basis of the default value of the verify voltage AV and the adjustment value ΔVvf7 is one example of a "second verify voltage". The verify voltage BVS adjusted on the basis of the default value of the verify voltage BV and the adjustment value ΔVvf0 is one example of a "third verify voltage". The verify voltage BVS adjusted on the basis of the default value of the verify voltage BY and the adjustment value ΔVvf7 is one example of a "fourth verify voltage".

In contrast to this, different values may be set to a set of the adjustment values ΔVvf for the verify voltage AV, a set of the adjustment values ΔVvf for the verify voltage BV, and a set of the adjustment values ΔVvf for the verify voltage CV. This example is shown in FIG. 10.

FIG. 10 is a diagram showing another example of the content of the adjustment value management table T2.

In the example shown in FIG. 10, as adjustment values ΔVvf for each word line WL, an adjustment value ΔVvfA (ΔVvfA0 to ΔVvfA15) for the verify voltage AV, an adjustment value ΔVvfB (ΔVvfB0 to ΔVvfB15) for the verify voltage BV, and an adjustment value ΔVvfC (ΔVvfC0 to ΔVvfC15) for the verify voltage CV are set. The adjustment value ΔVvfA, the adjustment value ΔVvfB, and the adjustment value ΔVvfC may be different values from each other. In this case, the adjustment amounts of the verify voltages AV, BY, and CV may be different from each other.

In other words, in this case, the adjusted verify voltage AVS applied to each word line WL is obtained on the basis of the default value (first common reference value) of the verify voltage AV and an adjustment value ΔVvfA (ΔVvfA0 to ΔVvfA15) set to each word line WL in correspondence with the verify voltage AV. The adjusted verify voltage BVS applied to each word line WL is obtained on the basis of the default value (second common reference value) of the verify voltage BV and an adjustment value ΔVvfB (ΔVvfB0 to ΔVvfB15) set to each word line WL in correspondence with the verify voltage BV. The adjusted verify voltage CVS applied to each word line WL is obtained on the basis of the default value (third common reference value) of the verify voltage CV and an adjustment value ΔVvfC (ΔVvfC0 to ΔVvfC15) set to each word line WL in correspondence with the verify voltage CV.

In this case, the adjustment value ΔVvfA0 is one example of the "first adjustment value". The adjustment value ΔVvfA7 is one example of the "second adjustment value". The adjustment value ΔVvfB0 is one example of the "third adjustment value". The adjustment value ΔVvfB7 is one example of the "fourth adjustment value". In addition, the verify voltage AVS adjusted on the basis of the default value of the verify voltage AV and the adjustment value ΔVvfA0 is one example of the "first verify voltage". The verify voltage AVS adjusted on the basis of the default value of the verify voltage AV and the adjustment value ΔVvfA7 is one example of the "second verify voltage". The verify voltage BVS adjusted on the basis of the default value of the verify voltage BV and the adjustment value ΔVvfB0 is one example of the "third verify voltage". The verify voltage BVS adjusted on the basis of the default value of the verify voltage BV and the adjustment value ΔVvfB7 is one example of the "fourth verify voltage".

Each of the set of the adjustment values ΔVvfA for the verify voltage AV, the set of the adjustment values ΔVvfB for the verify voltage BV, and the set of the adjustment values ΔVvfC for the verify voltage CV, for example, has similar characteristics to those of the adjustment values ΔVvf described with reference to FIG. 8. In other words, in each of the sets of the adjustment values ΔVvfA, ΔVvfB, and ΔVvfC, adjustment values ΔVvf0 and ΔVvf15 for the word lines WL0 and WL15 (the first-end word line WLE1 and the second-end word line WLE2 described above) of both ends are maximum among the adjustment values ΔVvf0 to ΔVvf15. On the other hand, adjustment values ΔVvf7 and ΔVvf8 for the word lines WL7 and WL8 (the center word lines WLC described above) of the center are minimum among the adjustment values ΔVvf0 to ΔVvf15 and, for example, are zero. In addition, in a plurality of word lines WL which are close to the word lines (word lines WL0 and WL15) of the ends, a word line WL closer to the end has a larger adjustment value ΔVvf.

<1.2.3. Operation of Memory System>

Next, the flow of the operation of the memory system 1 according to the first embodiment will be described.

Figure 11:
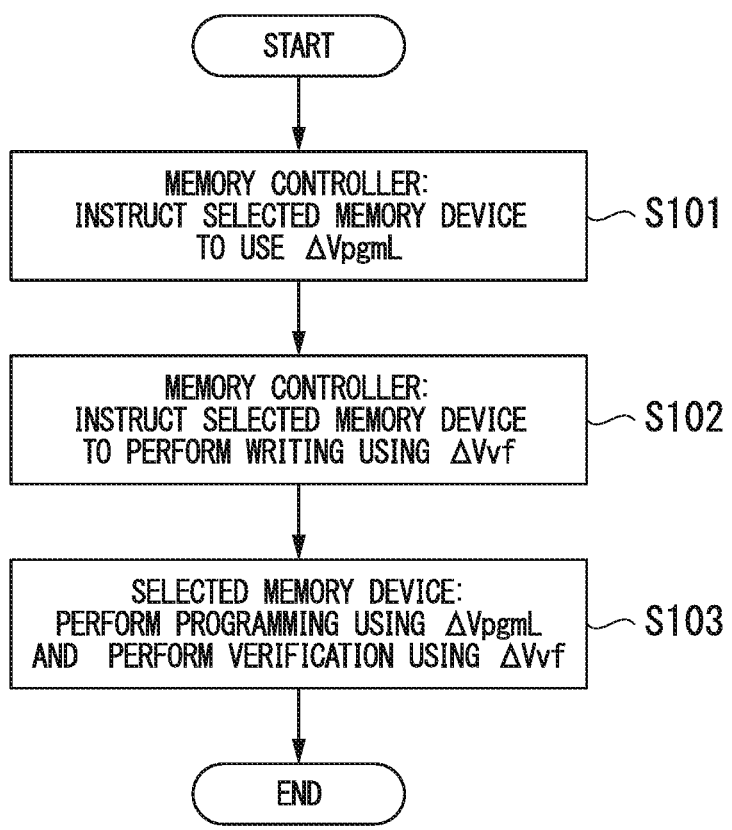
FIG. 11 is a flowchart showing an example of the flow of an operation according to the first embodiment.

FIG. 11 is a flowchart showing an example of the flow of the operation of the memory system 1. In FIG. 11, for simplicity, a process relating to writing data into one memory device (selected memory device) 100 is focused on. In addition, the default value of the verify voltage Vvf is instructed in advance by the memory controller 200 to the selected memory device 100. Instead of this, the default value of the verify voltage Vvf, for example, may be stored in the register 121 of the memory device 100 in advance, or the default value of the verify voltage Vvf may be read from the storage 11a of the memory device 100 and be stored in the register 121 so as to be referred to by the memory device 100.

First, the memory controller 200 instructs the selected memory device 100 to use the increment ΔVpgmL (S101). Next, the memory controller 200 transmits a DQ signal shown in FIG. 6 to the selected memory device 100, thereby instructing the selected memory device 100 to perform writing using the adjustment value ΔVvf (S102). Accordingly, the selected memory device 100 performs programming using the increment ΔVpmL and performs verification using the adjustment value ΔVvf (S103). In other words, the selected memory device 100 obtains the values of the verify voltages VvfS (AVS, BVS, CVS) after the adjustment on the basis of the default value of the verify voltage Vvf and the adjustment value ΔVvf corresponding to each word line WL. Then, the selected memory device 100 performs verification by using the verify voltage VvfS after the adjustment. The control process performed by the memory controller 200 is, for example, realized by the general controller 26. In addition, the control process performed by the selected memory device 100 is, for example, is performed by the sequencer 12.

<1.3. Advantages>

According to the first embodiment, both an increase in the writing speed of the memory system 1 and a decrease in the number of error bits upon reading according to an improvement of the writing are realized. The details thereof are as shown below.

It is preferable that the width of the distribution (lobe) of threshold voltages of cell transistors MT after writing for each state is narrow. The reason for this is that, if the widths of lobes are narrow, overlapping between lobes adjacent to each other is small, and hence the number of error bits decreases. In order to narrow the widths of lobes after writing, it is preferable that the magnitude of the programming voltage Vpgm is low. The reason for this is that, when a programming voltage Vpgm having a large value is applied, the threshold voltage greatly rises. For example, applying a high programming voltage Vpgm may cause a cell transistor MT with a threshold voltage slightly below the verify voltage Vvf to have a threshold voltage excessively higher than the verify voltage Vvf after applying one more pulse of the programming voltage Vpgm. In addition, when focusing on the increment ΔVpgm, in order to decrease the width of the distribution after ting, it is preferable that the magnitude of the increment ΔVpgm is small. The reason for this is that the threshold voltage greatly rises according to applying one pulse of the programming voltage Vpgm accompanying the increment ΔVpgm of a large value. For example, applying a programming voltage Vpgm to which the increment ΔVpgm with a large value is added may cause a cell transistor MT with a threshold voltage slightly below the verify voltage Vvf to have a threshold voltage excessively higher than the verify voltage Vvf after applying one more pulse of the programming voltage Vpgm. Meanwhile, when the value of the increment ΔVpgm is smaller, a writing time is longer. By considering this tradeoff, the default value of the increment ΔVpgm is determined.

However, in using the increment ΔVpgm which is the default value, there are cases where the performance required for the memory system 1 may not be satisfied. In other words, there are cases where the performance required for the memory system 1 is very high, and the performance required for the memory system 1 may not be satisfied by improving only the performance of the memory device 100. In order to cope with such a problem, the operation speed of the memory system 1 is tried to be improved by controlling the memory device 100 using the memory controller 200 in some cases. More specifically, as described with reference to FIG. 5, the memory controller 200 increases the writing speed for the memory device 100 by instructing the memory device 100 to use the increment ΔVpgmL. In this way, the writing speed of the memory system 1 may be improved.

Meanwhile, as described above, when the value of the increment ΔVpgm is large, the width of the distribution of the threshold voltages after writing in each state is large (for example, the tail of the high electric potential side is long), and furthermore, there is a high probability that a read error will occur. Here, there are cases where the degree of an increase in the width of the distribution depends on the locations of the word lines WL. More specifically, when a writing target cell transistor MT is surrounded by other cell transistors MT (for example, many cell transistors MT in the state Er), the writing to the writing target cell transistor MT may be affected by the other cell transistors, and it may become difficult to write data into the writing target cell transistor MT due to the inter-cell interference (adjacent cell effect, Yupin effect). On the other hand, it is relatively easy to write data into a cell transistor MT of the string STR, which is located on the endmost side, and it is easy to write data into a cell transistor MT located at the end in the string STR.

Figure 12:
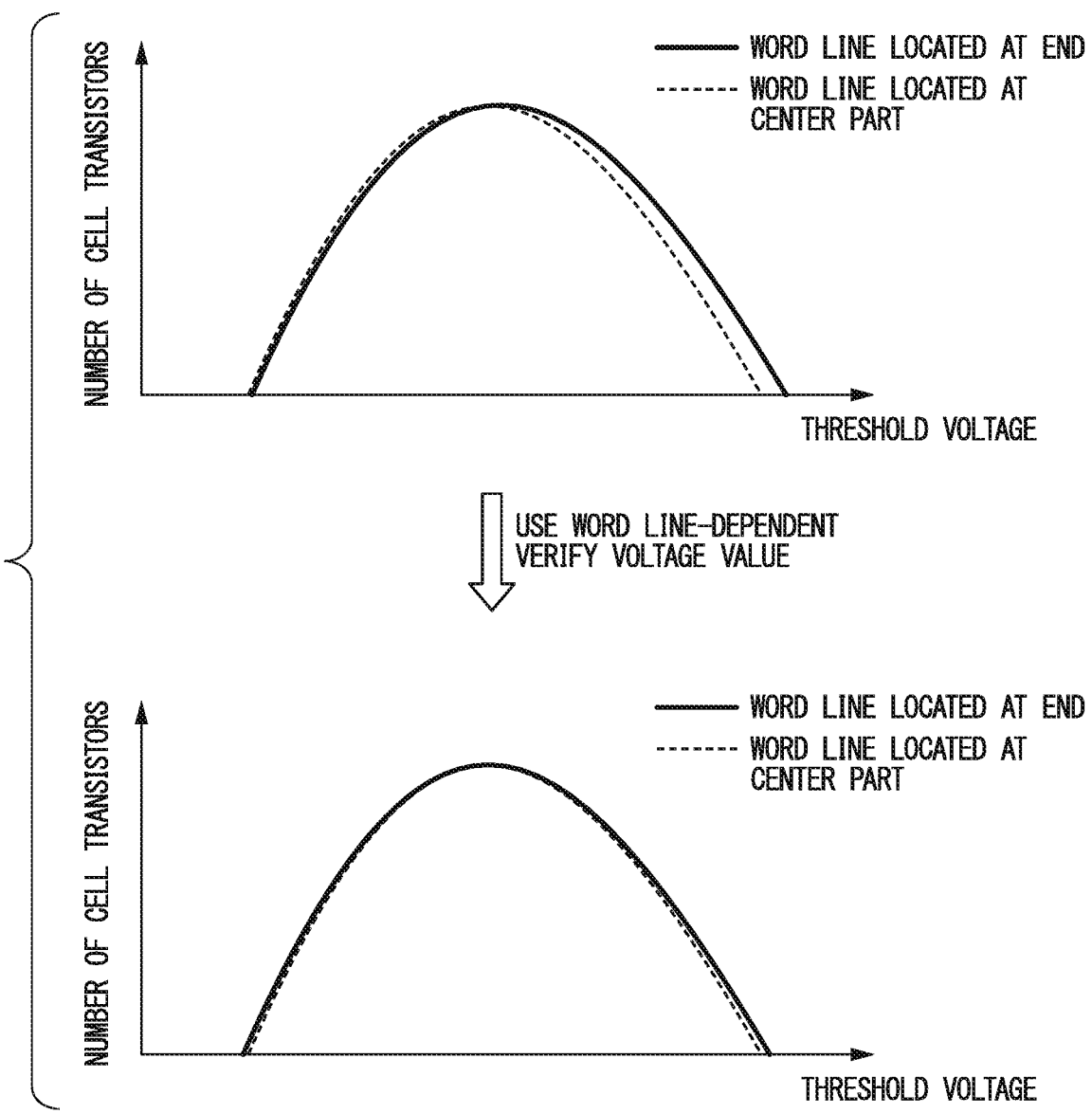
FIG. 12 is a diagram showing threshold voltage distributions according to the first embodiment and a comparative example.

Due to a variation in the degree of easiness in writing, in a case where writing for all the cell transistors MT is performed using a common verify voltage Vvf, a cell transistor MT into which data can be more easily written has a threshold voltage higher than that of a cell transistor MT having a common degree of easiness in writing even when they are written into the same state. This is shown in an upper part of FIG. 12. The upper part of FIG. 12 shows two distributions of threshold voltages; a distribution (solid line) of threshold voltages relating to cell transistors MT connected to word lines WL (for example, the first-end word line WLE1) disposed at the end, and a distribution (broken line) of threshold voltages relating to cell transistors MT connected to word lines WL (for example, the center word line WLC) disposed at the center part. As shown in the upper part of FIG. 12, some of the threshold voltages for the word lines WL disposed at the end may be higher (for example, the distribution of threshold voltages expanding to the high electric potential side) than the threshold voltages for the word lines WL disposed at the center part. As a result, the width of the distribution of threshold voltages is large (for example, the tail of the high-electric potential side is long), which leads to an increase in the number of error bits upon reading. In such a situation with a wide distribution of the threshold voltages, a common optimal read voltage Vcgr may not fit for reading an individual word line WL to reduce the number of error bits, since the optimal read voltage Vcgr is defined for a plurality of word lines WL.

On the other hand, according to the first embodiment, the memory controller 200 adjusts the voltage level of the verify voltage Vvf for each word line WL by using a plurality of adjustment values ΔVvf. Accordingly, the verify voltage Vvf applied to the word line WL disposed at the end in the string STR (and word lines WL which are close to the end) is decreased. For this reason, a distribution of threshold voltages for the word lines WL disposed at the end (and word lines WL disposed to be close to the end) is close to the distribution of threshold voltages for the word lines WL disposed at the center part. As a result, the width the distribution is narrowed (for example, the tail of the high electric potential side is shortened), and the number of error bits upon reading decreases. In addition, this can be achieved together with an increase in the writing speed of the memory system 1 according to the use of the increment ΔVpgmL. When the number of error bits upon reading decreases, the life and the yield of the memory system 1 are improved.

To sum up the description presented above, in a case where it is determined whether the writing of the first data value into the first cell transistor MT has been completed, the memory controller 200 according to the first embodiment transmits the first adjustment value (for example, the adjustment value ΔVvf0) selected from among a plurality of adjustment values to the memory device 100, thereby instructing the memory device 100 to apply the first verify voltage to the first word line WL (for example, the word line WL0). In addition, in a case where it is determined whether the writing of the first data value into the second cell transistor MT has been completed, the memory controller 200 transmits the second adjustment value (for example, the adjustment value ΔVvf7) selected from among the plurality of adjustment values to the memory device 100, thereby instructing the memory device 100 to apply the second verify voltage that is different in voltage level from the first verify voltage to the second word line WL (for example, the word line WL7). Here, a "voltage level" represents the magnitude (voltage value) of a voltage applied as a verify voltage. For example, a plurality of "voltage levels" of the verify voltages are set for each of the states (states A, B, and C) of the distribution of threshold voltages of cell transistors MT. In other words, for example, a plurality of voltage levels of the verify voltages AV are set for the distribution of the state A of the threshold voltages. In addition, the term "voltage levels being different", for example, means that, the electric potentials generated by the electric potential generating circuit 13 as electric potentials applied to the word lines WL are different, or that the electric potentials selected by the driver 14 are different, since parameters used for determining the voltage levels are different. In addition, the term "a case where it is determined whether writing the M-th data value into the N-th cell transistor has been completed (here, N and M are natural numbers)" represents distinguishing an operation called "verify" and an operation (the programming described above) of injecting electrons into the electric charge accumulation layer of the cell transistor MT from each other. For this reason, "a case where it is determined whether writing the M-th data value into the N-th cell transistor has been completed (here, N and M are natural numbers)" may be replaced with "a case where the amount of electrons injected into the electric charge accumulation layer of the cell transistor MT is determined", "a case where the threshold voltage of the cell transistor MT is determined", "a case where a voltage is applied to a word line WL in the same programming loop as that of the operation of injecting electrons into the electric charge accumulation layer of the cell transistor MT", or the like.

In the first embodiment, in a case where it is determined whether the writing of the first data value into the first cell transistor MT has been completed, the memory controller 200 instructs the memory device 100 to apply the first verify voltage of which the voltage level is adjusted on the basis of the first adjustment value and the first common reference value (for example, the default value of the verify voltage AV) to the first word line WL. In addition, in a case where it is determined whether the writing of the first data value into the second cell transistor MT has been completed, the memory controller 200 instructs the memory device 100 to apply the second verify voltage of which the voltage level is adjusted on the basis of the second adjustment value and the first common reference value to the second word line WL. The term "to instruct the memory device to apply the verify voltage of which the voltage level is adjusted on the basis of the adjustment value and the common reference value to the word line" described here is not limited to a case where the instruction is achieved by transmitting the value of the verify voltage of which the voltage level is adjusted on the basis of the adjustment value and the common reference value from the memory controller 200 to the memory device 100 but includes a case where, as described in the first embodiment, the instruction is achieved by transmitting the adjustment value ΔVvf of the verify voltage Vvf from the memory controller 200 to the memory device 100.

In addition, respectively applying the first verify voltage and the second verify voltage, which are different from each other, to the first word line and the second word line is not limited to a case where respective application of the first verify voltage and the second verify voltage to the first word line and the second word line is realized on the basis of an instruction by transmitting one or a plurality of adjustment values from the memory controller 200 to the memory device 100. For example, the controller 200 may instruct the memory device 100 to respectively apply the first verify voltage and the second verify voltage to the first word line and the second word line by obtaining a value (a value acquired by using an adjustment value) of each verify voltage VvfS according to the adjustment on the basis of each adjustment value and the default value of the verify voltage Vvf, and transmitting the obtained value of each verify voltage VvfS to the memory device 100.

In addition, the configuration of the first embodiment is not limited to the memory device 100 (two-dimensional NAND memory) in which a plurality of word lines WL are arranged in a planar shape. The configuration of the first embodiment may be applied to a memory device 100 (three-dimensional NAND memory), as described in a second embodiment, in which a plurality of word lines WL are stacked in a three-dimensional manner.

(Second Embodiment)

Next, a second embodiment will be described. The second embodiment is different from the first embodiment at least in a point in which adjustment values ΔVvf of verify voltages Vvf are set according to the sizes of cell transistors MT. Configurations other than those described below are similar to the configurations according to the first embodiment.

<2.1. Configuration (Structure)>
<2.1.1. Cell Array>

Figure 13:
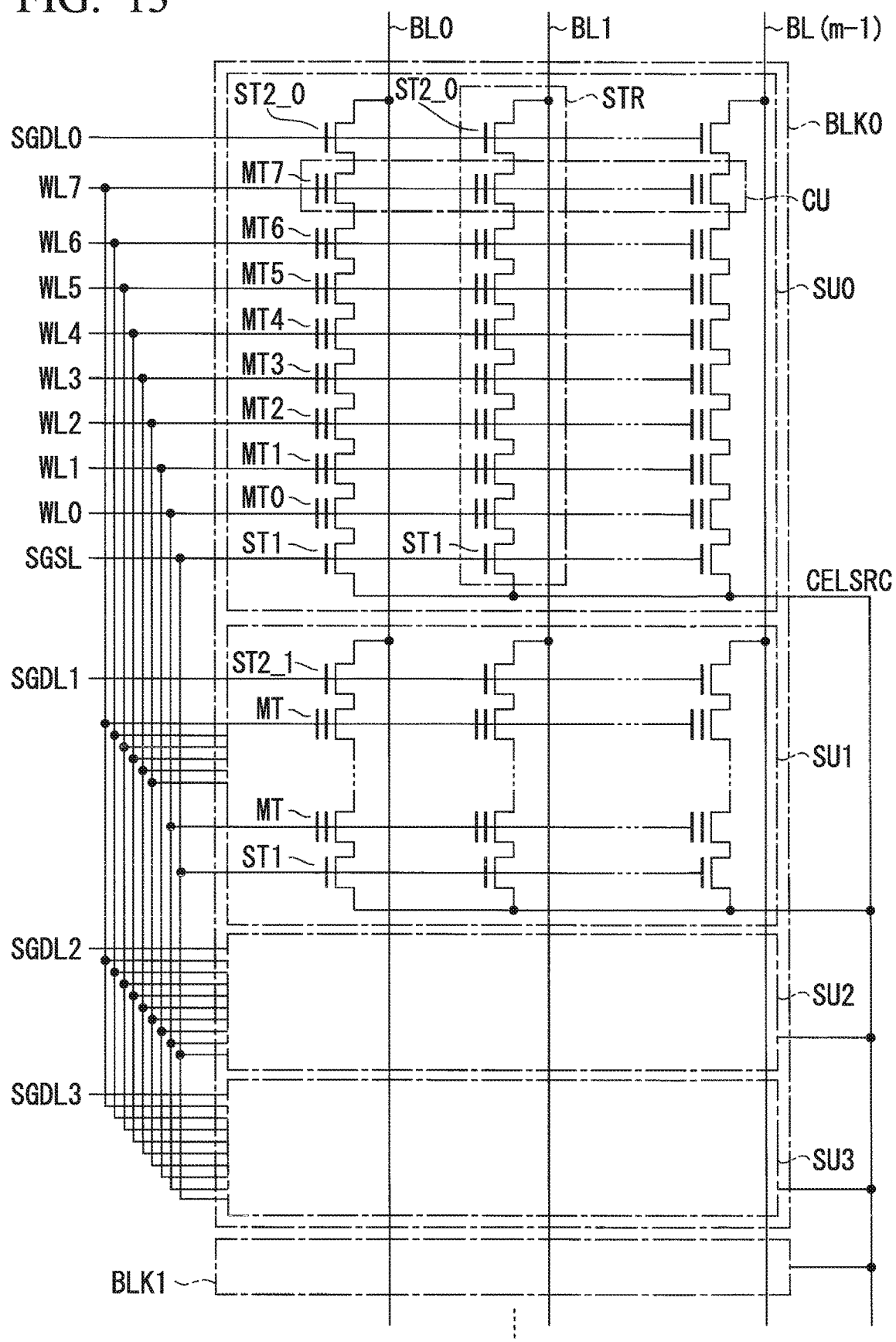
FIG. 13 is a block diagram showing a configuration of a part of a memory cell array according to a second embodiment.

FIG. 13 shows an example of elements and connections of a memory cell array 11 according to the second embodiment and is a diagram showing elements and connections of a block BLK0 and related elements. The memory cell array 11 according to the second embodiment is a memory device 100 (a three-dimensional NAND) in which a plurality of word lines WL are stacked in a three-dimensional manner.

As shown in FIG. 13, each block BLK includes a plurality of (for example, four) string units SU (SU0 to SU3). Each of m (here, m is a natural number) bit lines BL0 to BL(m−1) is connected to one string STR included in each of four string units SU0 to SU3 in each block BLK. Each string STR includes one first selection gate transistor ST1, a plurality of (for example, eight) cell transistors MT, and one second selection gate transistor ST2 (ST2_0 to ST2_3). The first selection gate transistor ST1, the cell transistors MT, and the second selection gate transistor ST2 are connected in series between a source line CELSRC and one bit line BL in this order.

A plurality of stings STR connected to a plurality of different bit lines BL forms one string unit SU. In each string unit SU, control gate electrodes of the cell transistors MT0 to MT7 are respectively connected to the word lines WL0 to WL7. In addition, in each block BLK, the word lines WL of a same address in different string units STR are connected to each other.

The selection gate transistors ST2_0 to ST2_3 respectively belong to the string units SU0 to SU3. For each α (here, α is 0 or a natural number of three or less), a control gate electrode of a selection gate transistor ST2_α of each of a plurality of strings STR of a string unit SUα is connected to a selection gate line SGDLα. A control gate electrode of the selection gate transistor ST1 is connected to a selection gate line SGSL.

<2.1.2. Physical Structure of Cell Array>

Figure 14:
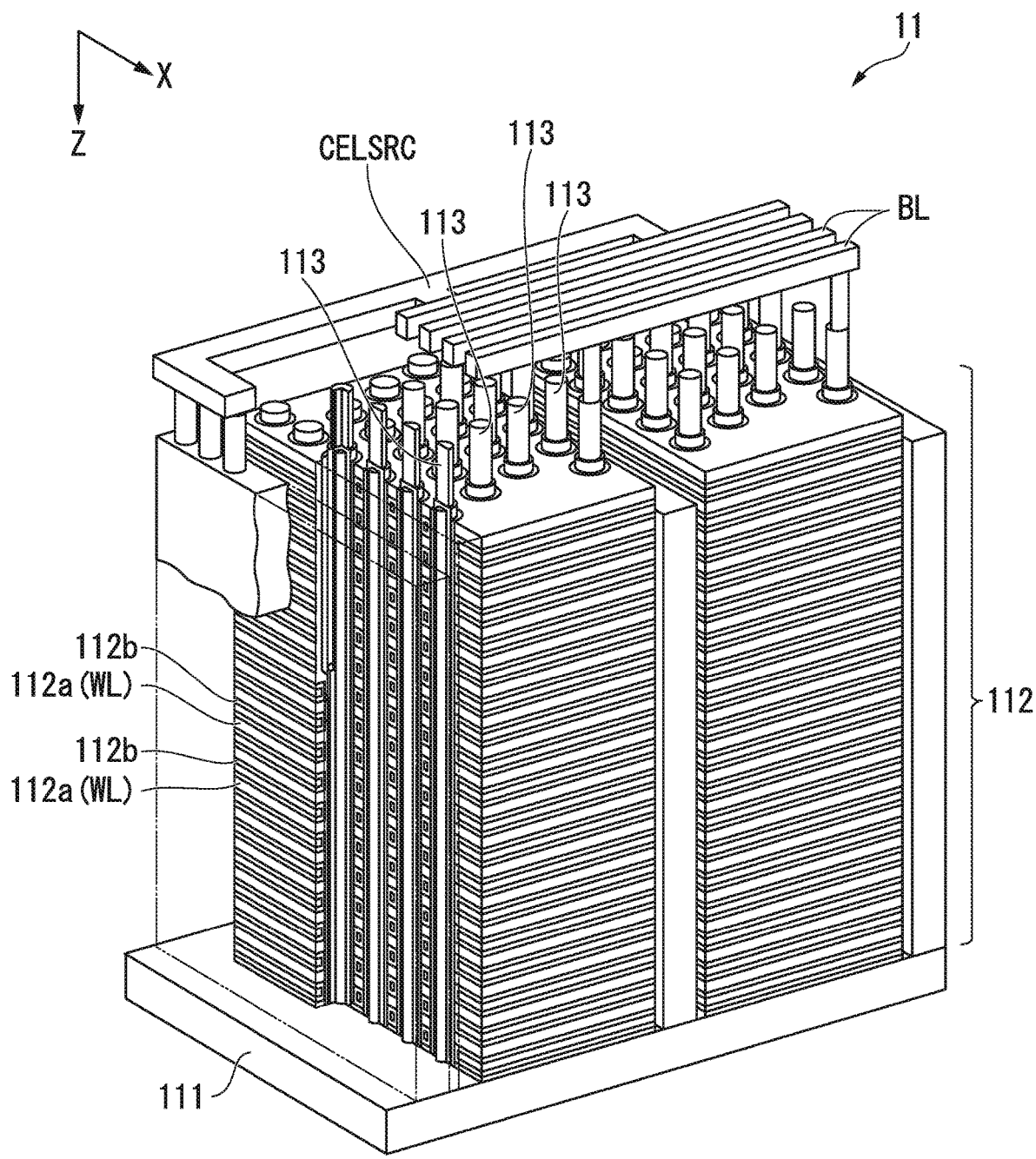
FIG. 14 is a perspective cross-sectional view showing a part of the memory cell array according to the second embodiment.

FIG. 14 is a perspective cross-sectional view showing some elements of the memory cell array 11 according to the second embodiment. As shown in FIG. 14, the memory cell array 11 includes a semiconductor substrate 111, a stack body 112 stacked on the semiconductor substrate 111, and a plurality of pillars (memory pillars) 113.

The semiconductor substrate 111 is an example of a "substrate". The semiconductor substrate 111 represents an element serving as a base on which the stack body 112 is stacked. The semiconductor substrate 111, similar to the first embodiment, may be referred to as a "base" a "supporter", or the like.

The stack body 112 includes a plurality of conductive layers 112a and a plurality of insulating layers 112b. The plurality of conductive layers 112a and the plurality of insulating layers 112b are alternately stacked in the height (thickness) direction of the semiconductor substrate 111. Each conductive layer 112a serves as a word line WL, the first selection gate line SGSL, or the second selection gate line SGDL. Here, a "first direction Z" and a "second direction X" will be defined. The first direction Z is a direction in which the plurality of conductive layers 112a and the plurality of insulating layers 112b are alternately stacked. The second direction X is a direction that is substantially orthogonal to the first direction Z.

The plurality of pillars 113 extend in the first direction Z inside the stack body 112. The pillar 113 includes a core insulating layer and a semiconductor layer disposed on the outer peripheral side of the core insulating layer. In the second embodiment, the cell transistors MT are disposed at intersection portions of the pillars 113 and the word lines WL. In addition, the first selection gate transistors ST are disposed at intersection portions of the pillars 113 and the first selection gate line SGSL. The second selection gate transistors DT are disposed at intersection portions of the pillars 113 and the second selection gate line SGDL.

Figure 15:
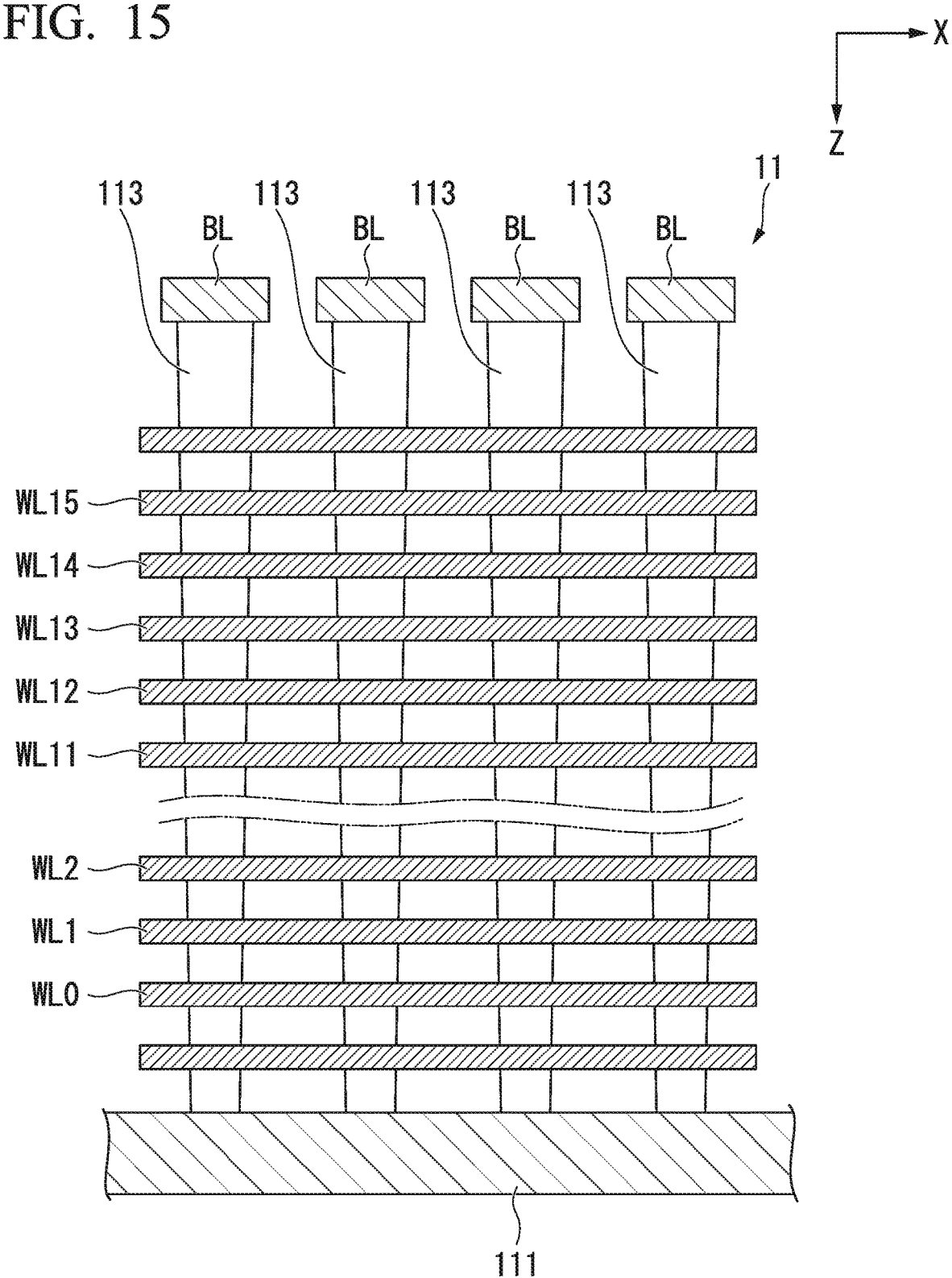
FIG. 15 is a cross-sectional view showing a part of the memory cell array according to the second embodiment.

FIG. 15 is a cross-sectional view showing the memory cell array 11 according to the second embodiment. In FIG. 15, for the convenience of description, the insulating layers 112b are not shown. As shown in FIG. 15, each pillar 113, for example, due to manufacturing factors or the like, becomes gradually thinner in the first direction Z. For example, the pillars 113 may become gradually thinner as they approach the semiconductor substrate 111. For this reason, the sizes of the plurality of cell transistors MT in the second direction X (hereinafter, simply referred to as "size") are different depending on the diameters of the pillar 113. For example, the size of the cell transistor MT decreases as the diameter of the pillar 113 at which the cell transistor MT intersects decreases. When the size of the cell transistor MT is small, even in a case where the same voltage is applied to a corresponding word line WL, the electric field generated in the cell transistor MT is large.

<2.2. Operation>
<2.2.1 Adjustment of Verify Voltage>

In the second embodiment, adjustment values ΔVvf relating to verify voltages Vvf are set according to the size in the second direction X of cell transistors MT which are connected to a word line WL. In other words, the adjustment value ΔVvf relating to the verify voltage Vvf is set according to a distance between a reference location (for example, a surface of the semiconductor substrate 111) relating to the first direction Z and each word line WL in the first direction Z.

Figure 16:
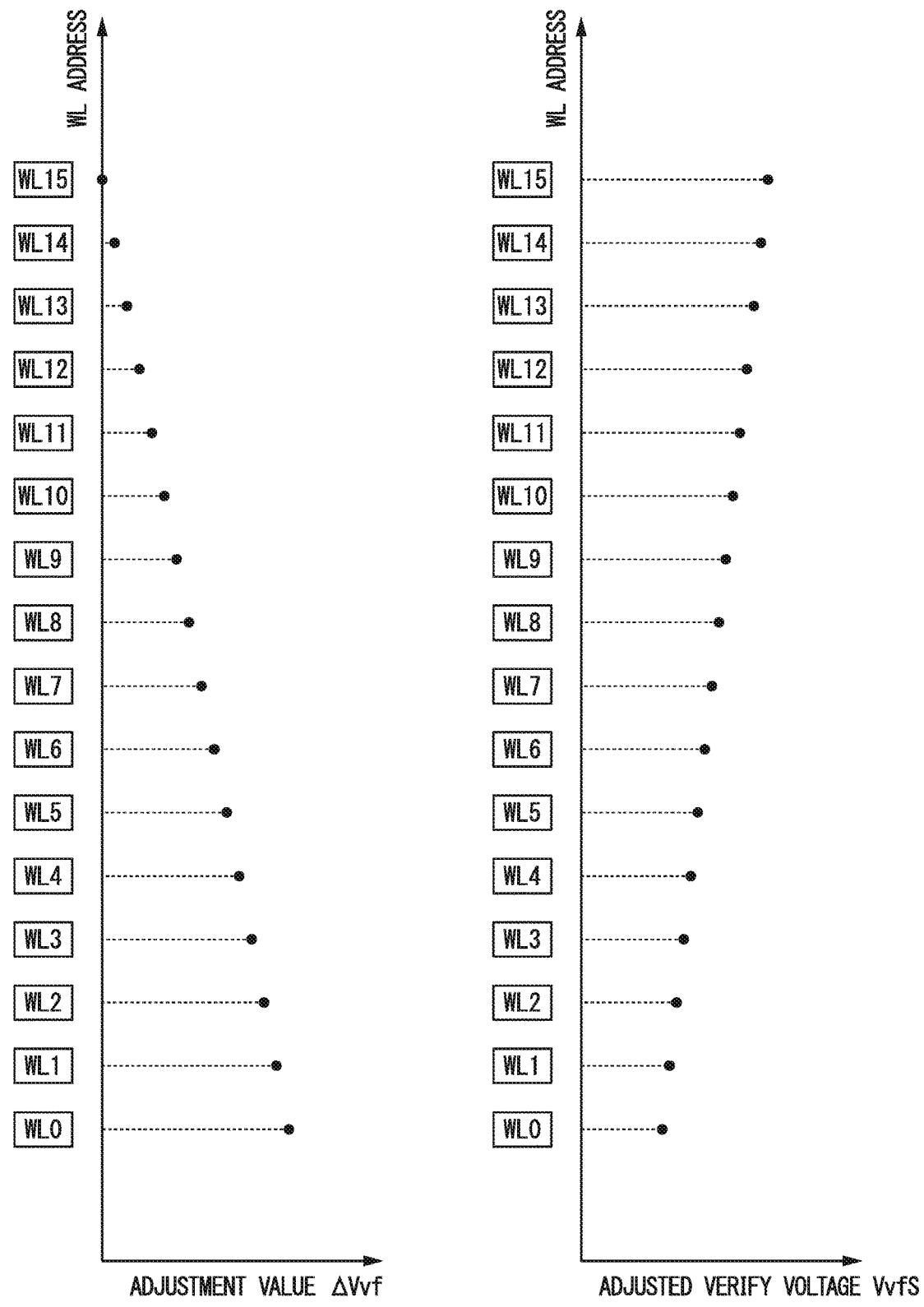
FIG. 16 is a diagram showing adjustment values for a plurality of word lines according to the second embodiment.

FIG. 16 shows addresses of a plurality of word lines WL and an adjustment value ΔVvf corresponding to each word line WL. The plurality of word lines WL may be a plurality of word lines corresponding to one sting STR or a plurality of word lines corresponding to a plurality of strings STR. The plurality of word lines WL are arranged in the first direction Z. FIG. 16 shows an example including 16 word lines WL. However, the number of word lines WL is not limited to that of the example described above. In the second embodiment, the word lines WL0 to WL15 become further away from the semiconductor substrate 111 as the value of N of the word line WLN (here, N is a natural number) increases. Regarding the word lines WL0 to WL15, the size of a cell transistor MT to which the word line WL is connected gradually increases as the value of N of the word line WLN (here, N is a natural number) increases. The method for assigning addresses (word lines WL0 to WL15) to the word lines WL is not limited to that of the example described above, and the addresses may be assigned in the reverse order. In other words, the word lines WL0 to WL15 may be located closer to the semiconductor substrate 111 as the value of N of the word line WLN (here, N is a natural number) increases. In such a case, regarding the word lines WL0 to WL15, as the value of N of the word line WLN (here, N is a natural number) increases, the size of the cell transistor MT to which the word line WL is connected gradually decreases.

In the second embodiment, among the plurality of cell transistors MT connected to the word lines WL0 to WL15, the size of the cell transistor MT connected to the word line WL0 is smallest. In addition, among the plurality of cell transistors MT connected to the word lines WL0 to WL15, the size of the cell transistor MT connected to the word line WL15 is largest. In the second embodiment, the word line WL0 is an example of a "first word line". In addition, the cell transistor MT connected to the word line WL0 is an example of a "first cell transistor". On the other hand, the word line WL15 is an example of a "second word line". In addition, the cell transistor MT connected to the word line WL15 is an example of a "second cell transistor". However, each of the first word line and the second word line may be any one of the word lines WL0 to WL15.

As shown in FIG. 16, in the second embodiment, among the adjustment values ΔVvf0 to ΔVvf15, the adjustment value ΔVvf0 used for the word line WL0 connected to the cell transistor MT having a smallest size is largest. On the other hand, among the adjustment values ΔVvf0 to ΔVvf15, the adjustment value ΔVvf15 used for the word line WL15 connected to the cell transistor MT having a largest size is smallest. In the second embodiment, the values (for example, the absolute values) of the adjustment values ΔVvf0 to ΔVvf15 decrease as the value of N of the adjustment value ΔVvfN (here, N is a natural number) is increased (in other words, the location of a corresponding word line WL becomes further away from the semiconductor substrate 111). These adjustment values ΔVvf0 to ΔVvf15 are registered in the adjustment value management table T2.

In a case where the adjustment values ΔVvf as above are set, as the verify voltage VvfS after the adjustment, the verify voltage Vvf0 applied to the word line WL0 connected to the cell transistor MT having a smallest size among those of the plurality of word lines WL is lowest among the verify voltages Vvf0 to Vvf15. On the other hand, as the verify voltage VvfS after the adjustment, the verify voltage Vvf15 applied to the word line WL15 connected to the cell transistor MT having a largest size among those of the plurality of word lines WL is highest among the verify voltages Vvf0 to Vvf15. In addition, the verify voltages Vvf0 to Vvf15 that are verify voltage VvfS after the adjustment are higher when the value of N of the verify voltage VvfN (here, N is a natural number) is higher (in other words, when the location of a corresponding word line WL is further away from the semiconductor substrate 111).

<2.3. Advantages>

As in the second embodiment, in a case where the diameter of the pillar 113 is not constant, and the sizes of the plurality of cell transistors MT are different from each other, when the same voltage is applied to corresponding word lines WL, electric fields generated in the cell transistors MT have different intensity. For example, in the cell transistor MT having a small size, an electric field may be relatively easily generated, and data can be written relatively easily. On the other hand, in the cell transistor MT having a large size, it is relatively difficult for an electric field to be generated, and it is relatively difficult for data to be written therein. For this reason, when data is written into all the cell transistors MT using the common verify voltage Vvf, a cell transistor MT having a greater degree of easiness in writing data therein has a higher threshold voltage than a cell transistor MT having a normal degree of easiness in writing data therein even when they are written into the same state.

Therefore, in the second embodiment, the verify voltages Vvf are adjusted such that the verify voltage Vvf applied to the word line WL connected to a cell transistor MT having a smaller size is smaller. For this reason, the distribution of the threshold voltages for the word lines WL connected to the cell transistors MT having a small size is close to the distribution of threshold voltages of the word lines WL connected to the cell transistors MT having a large size. As a result, the width of the distribution is small (for example, the tail of the high electric potential side is shortened), and the number of error bits upon reading is decreased. Accordingly, similar to the first embodiment, the life and the yield of the memory system 1 are improved.

(Modification of Second Embodiment)

Next, one modification of the second embodiment will be described. This modification is different from the second embodiment at least in a point in which a plurality of tiers are provided in the memory pillar 113. Configurations other than those described below are similar to the configurations according to the second embodiment.

Figure 17:
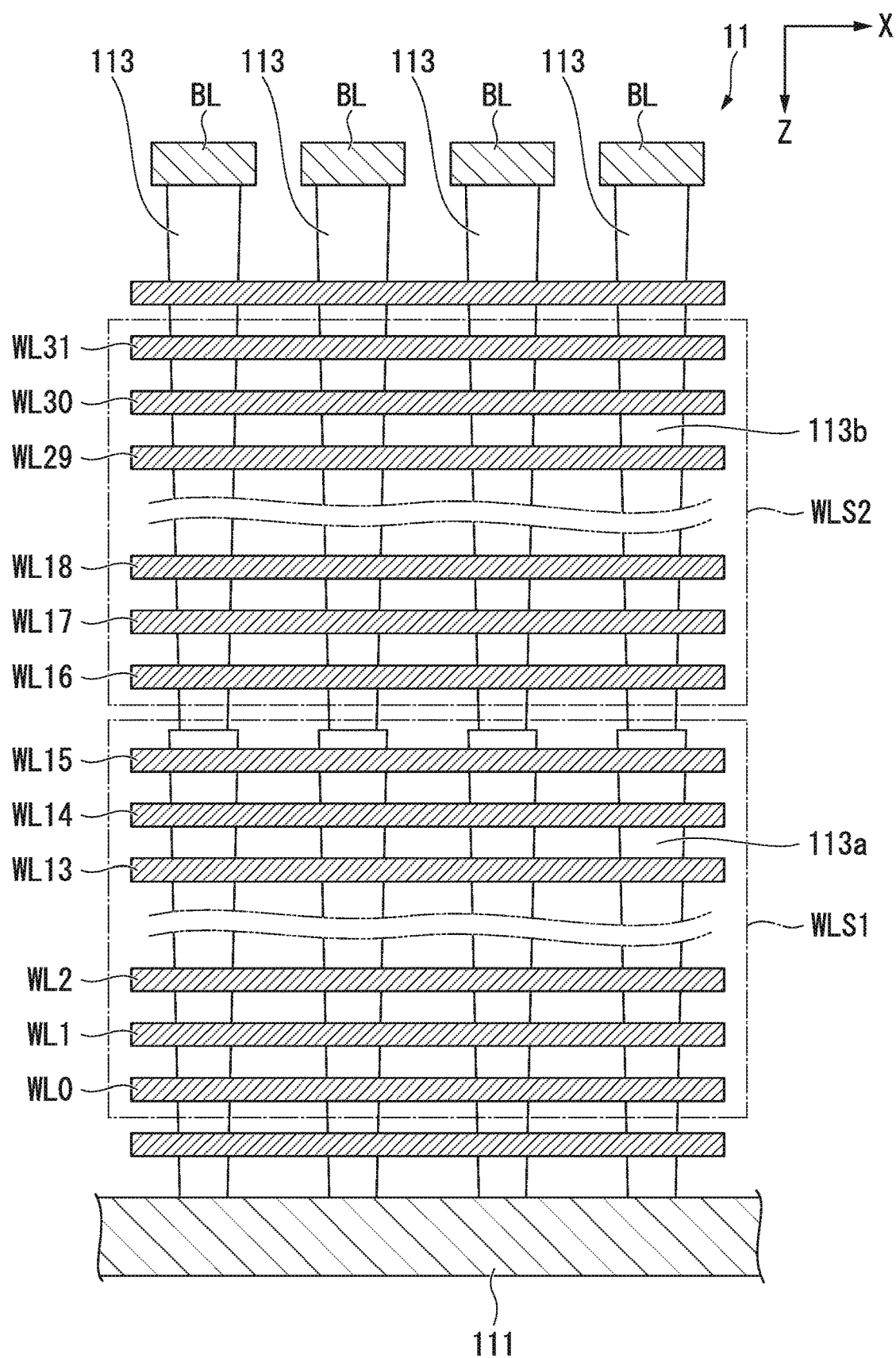
FIG. 17 is a cross-sectional view showing a part of a memory cell array according to a modification of the second embodiment.
Figure 18:
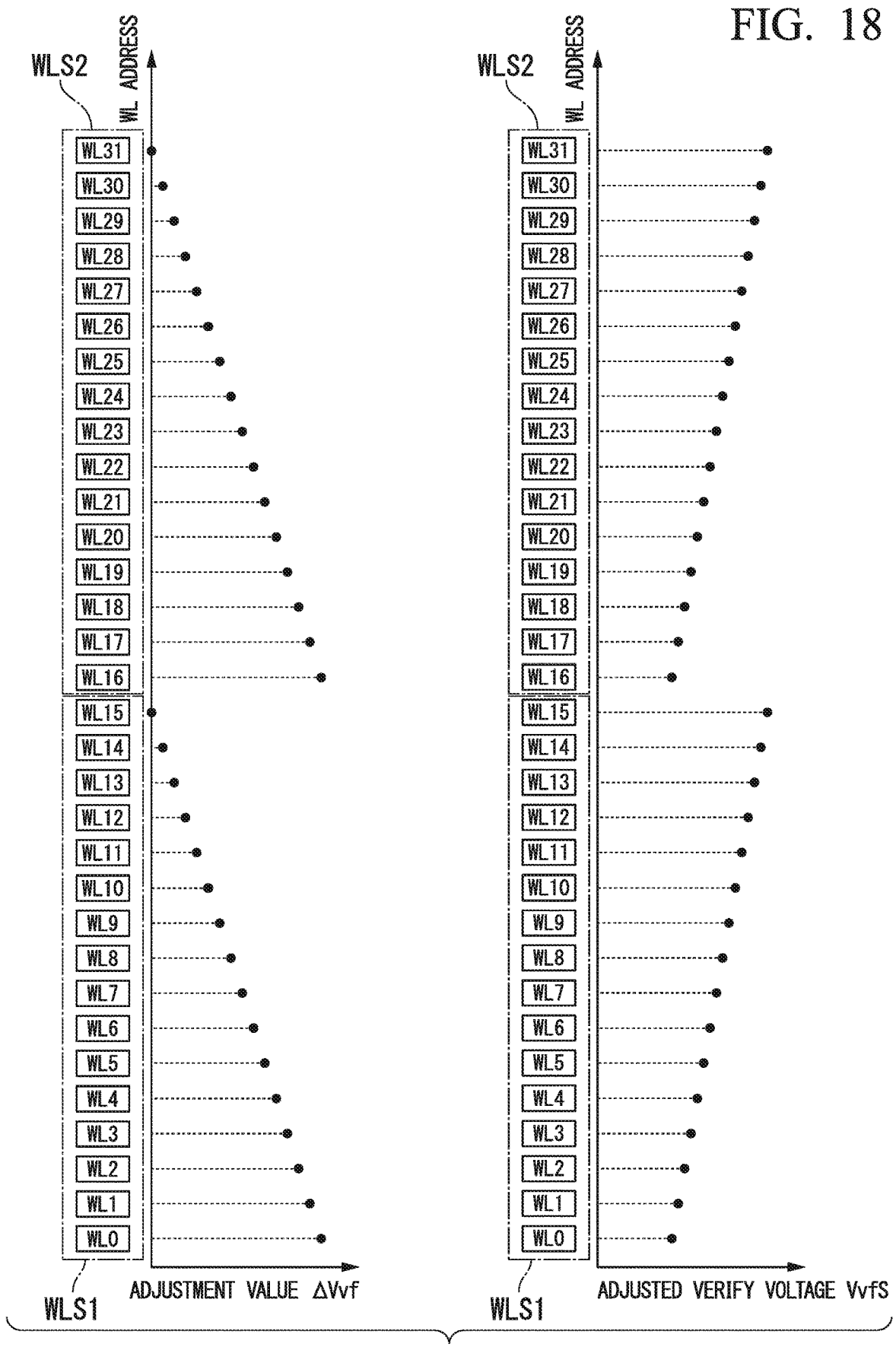
FIG. 18 is a diagram showing adjustment values for a plurality of word lines according to the modification of the second embodiment.

FIG. 17 is a cross-sectional view showing a memory cell array 11 according to the modification of the second embodiment. In FIG. 17, for the convenience of description, insulating layers 112b are not shown. In the modification of the second embodiment, the memory pillar 113 includes a plurality of tiers. For example, the memory pillar 113 includes a first tier 113a and a second tier 113b as the plurality of tiers. The first tier 113a and the second tier 113b may overlap each other in the first direction Z and may be connected to each other. In addition, the first tier 113a and the second tier 113b may not be connected to each other.

As hole formation processes for the stack body 112 are performed in a plurality of steps, the memory pillar 113 includes the first tier 113a and the second tier 113b. In other words, the first tier 113a is formed by forming a hole in the stack body 112 in a state in which the stack body 112 is stacked up to the middle and supplying the material of the memory pillar 113 to the inside of the hole. Meanwhile, the second tier 113b is formed after the formation of the first tier 113a of the memory pillar 113 in the stack body 112 by forming a hole in the stack body 112 in a state in which a remaining part of the stack body 112 is stacked and supplying the material of the memory pillar 113 to the inside of the hole.

In the memory pillar 113 having the configuration described above, each of the first tier 113a and the second tier 113b becomes gradually thinner as it goes in the first direction Z. For example, each of the first tier 113a and the second tier 113b becomes thinner as it goes toward the semiconductor substrate 111. In such a case, in a portion between the first tier 113a and the second tier 113b (a boundary portion, a connection portion), the diameter of the memory pillar 113 becomes larger as it goes in the first direction Z.

In the modification of the second embodiment, a plurality of word lines WL includes a first word line set WLS1 and a second word line set WLS2. Word lines WL (WL0 to WL15) belonging to the first word line set WLS1 are arranged in correspondence with the first tier 113a of the memory pillar 113. In other words, in the word lines WL (WL0 to WL15) belonging to the first word line set WLS1, the cell transistors MT are formed in the intersections of these word lines WL and the first tier 113a of the memory pillar 113. On the other hand, word lines WL (WL16 to WL31) belonging to the second word line set WLS2 are arranged in correspondence with the second tier 113b of the memory pillar 113. In other words, in the word lines WL (WL16 to WL31) belonging to the second word line set WLS2, the cell transistors MT are formed in the intersections of these word lines WL and the second tier 113b of the memory pillars 113. In the word lines WL0 to WL15, as the value of N of the word line WLN (here, N is a natural number) increases, the size of the cell transistor MT to which the word line WL is connected gradually increases. Similarly, in the word lines WL16 to WL31, as the value of N of the word line WLN (here, N is a natural number) increases, the size of the cell transistor MT to which the word line WL is connected gradually increases. However, the number of word lines WL is not limited to that of the example described above. In addition, the method for assigning addresses (word lines WL0 to WL31) to the word lines WL is not limited to that of the example described above, and the addresses may be assigned in a reverse order (in an order in which N of the word line WLN (here, N is a natural number) increases when approaching the semiconductor substrate 111). In addition, the order in which the addresses (word lines WL0 to WL15) are assigned to the word lines WL in the first word line set WLS1 and the order in which the addresses (word lines WL16 to WL31) are assigned to the word lines WL in the second word line set WLS2 may be different from each other.

As shown in FIG. 16, in the modification of the second embodiment, the adjustment values $\Delta Vvf0$ to $\Delta Vvf15$ are set to have similar characteristics to that of the adjustment values $\Delta Vvf0$ to $\Delta Vvf15$ according to the second embodiment. Similarly, the adjustment values $\Delta Vvf16$ to $\Delta Vvf31$ are set to have similar characteristics to that of the adjustment values $\Delta Vvf0$ to $\Delta Vvf15$ according to the second embodiment.

According to such a configuration, even in a case where the memory pillar 113 includes a plurality of tiers, similar to the second embodiment, the influence due to a difference in the sizes of the plurality of cell transistors MT can be mitigated, and the lifetime and yield of the memory system 1 can be improved. In addition, the writing characteristics variation due to various widths of a memory pillar 113 having a plurality of tiers can be decreased.

(Third Embodiment)

Next, a third embodiment will be described. The third embodiment is different from the first embodiment at least in a point in which adjustment values $\Delta Vvf$ of verify voltages Vvf are dynamically changed on the basis of a degree of wear of a cell transistor MT. Configurations other than those described below are similar to the configurations according to the first embodiment.

<3.1. Configuration (Structure)>

The configuration of a memory system 1 according to the third embodiment is similar to the configuration of the memory system 1 according to the first embodiment or the second embodiment. However, the configuration of the memory system 1 according to the third embodiment may be different from the configuration of the memory system 1 according to the first embodiment and the second embodiment.

<3.2. Operation>

<3.2.1. Determination of Wear>

In the third embodiment, a memory controller 200 (for example, the general controller 26 of the memory controller 200) determines a degree of wear of each block BLK. For example, as a wear of each block BLK, the memory controller 200 may determine the average wear of a plurality of cell transistors MT included in each block. Here, the "average wear" represents the average degree of wear of the plurality of cell transistors MT".

The degree of wear, for example, may be the number of times of writing. Alternatively, the degree of wear may be one or a combination of, the number of times of writing, the number of times of reading, the number of times of erasing, the temperature (or the temperature of any element inside the memory device 100, the temperature of a board on which the memory controller 200 is mounted, or the like) of the memory device 100, and any other indicator. The number of times of writing, the number of times of reading, the number of times of erasing, and the like relating to the cell transistor MT are stored in the storage 11a of the memory device 100 as a part of the operation log of the memory device 100. The memory controller 200 may acquire information such as the number of times of writing, the number of times of reading, the number of times of erasing, or the like relating to the cell transistor MT by referring to the operation log stored in the storage 11a of the memory device 100.

In addition, the cell transistors MT that are targets for the calculation of the average wear may be some representative cell transistors MT or all the cell transistors included in the block BLK. Instead of the degree of wear for each block BLK, the memory controller 200 may determine the degree of wear of each memory cell array 11 or the degree of wear of each selected memory device 100. Hereinafter, an example will be representatively described in which the memory controller 200 determines the degree of wear of the selected block BLK.

<3.2.2. Adjustment of Verify Voltage>

In the third embodiment, as an adjustment value $\Delta Vvf$ relating to the verify voltage Vvf, a different value is set for each wear (for example, the average wear of a plurality of cell transistors MT) of the selected block BLK.

Figure 19:
FIG. 19 is a diagram showing an example of a content of an adjustment value management table according to a third embodiment.

As shown in FIG. 19, in an adjustment value management table T2 according to the third embodiment, the adjustment values $\Delta Vvf$ set for each of the plurality of wear ranges are managed in association with wear ranges (a first wear range, a second wear range, . . . ), respectively. For example, for the first wear range, adjustment values $\Delta Vvf$ ($\Delta Vvf0$, $\Delta Vvf1$, are set for the plurality of word lines WL (WL0, WL1, . . . ). Similarly, for the second wear range, adjustment values $\Delta Vvf'$ ($\Delta Vvf0'$, $\Delta Vvf1'$, . . . ) are set for the plurality of word lines WL (WL0, WL1, . . . ). For the third wear range, adjustment values $\Delta Vvf''$ ($\Delta Vvf0''$, $\Delta Vvf1''$, . . . ) are set for the plurality of word lines WL (WL0, WL1, . . . ).

In the third embodiment, in the second wear range, compared to the first wear range, the degree of wear (for example, the average wear of the plurality of cell transistors MT) of the selected block BLK is high (severe). In addition, in the third wear range, compared to the second wear range, the degree of wear (for example, the average wear of the plurality of cell transistors MT) of the selected block BLK is higher (more severe).

The adjustment value ΔVvf' (ΔVvf0', ΔVvfF, . . . ) for the second wear range is smaller than the adjustment value ΔVvf (ΔVvf0, ΔVvf1, . . . ) for the first wear range. In other words, the adjusted verify voltage VvfS applied to the selected word line WL in the second wear range is higher than the adjusted verify voltage applied to the selected word line WL in the first wear range.

In this case, for example, a verify voltage AVS obtained on the basis of the default value of the verify voltage AV and the adjustment value ΔVvf0 is an example of a "first verify voltage". On the other hand, a verify voltage AVS obtained on the basis of the default value of the verify voltage AV and the adjustment value ΔVvf0' is an example of a "fifth verify voltage".

Similarly, the adjustment value ΔVvf" (ΔVvf0", ΔVvf1", . . . ) for the third wear range is smaller than the adjustment value ΔVvf (ΔVvf0', ΔVvf1' . . . ) for the second wear range. In other words, the adjusted verify voltage VvfS applied to the selected word line WL in the third wear range is higher than the adjusted verify voltage applied to the selected word line WL in the second wear range.

In addition, the plurality of adjustment values ΔVvf (ΔVvf0, ΔVvf1, . . . ) for the first wear range may be the same or be different from each other. Similarly, the plurality of adjustment values ΔVvf (ΔVvf0', ΔVvf1', . . . ) for the second wear range may be the same or be different from each other. The plurality of adjustment values ΔVvf" (ΔVvf0", ΔVvf1", . . . ) for the third wear range may be the same or different from each other.

In the third embodiment, in a case where the degree of wear (for example, the average wear of the plurality of cell transistors MT) of the selected block BLK is determined to be in the first wear range, the memory controller 200 instructs the selected memory device 100 to adjust the verify voltage Vvf by using the adjustment value ΔVvf (ΔVvf0, ΔVvf1, . . . ) set in correspondence with the first wear range. Similarly, in a case where the degree of wear (for example, the average wear of the plurality of cell transistors MT) of the selected block BLK is determined to be in the second wear range, the memory controller 200 instructs the selected memory device 100 to adjust the verify voltage Vvf by using the adjustment value ΔVvf (ΔVvf0', ΔVvf1', . . . ) set in correspondence with the second wear range. In a case where the degree of wear (for example, the average wear of the plurality of cell transistors MT) of the selected block BLK is determined to be in the third wear range, the memory controller 200 instructs the selected memory device 100 to adjust the verify voltage Vvf by using the adjustment value ΔVvf" (ΔVvf0", ΔVvf1", . . . ) set in correspondence with the third wear range.

<3.3, Operation>

In a state in which the wear of the cell transistor MT has not progressed yet, i.e., in a near fresh state, it is preferable to lower the voltage level of the verify voltage Vvf such that the wear will not progress easily. Meanwhile, in a case where the wear of the cell transistor MT has progressed, written data may easily be lost due to charge loss or other disturb. For this reason, in a state in which the wear of the cell transistor MT has progressed, there are cases where it is preferable to make the threshold voltage of the cell transistor MT high for a wide margin by making the voltage level of the verify voltage Vvf high (that is, the voltage level is adjusted to be close to or higher than the default value).

Thus, in the third embodiment, in a state in which the degree of wear s low, the verify voltage Vvf is adjusted such that the verify voltage Vvf applied to the selected word line WL becomes low. Accordingly, by using a lower verify voltage Vvf, it makes the cell transistor MT to be worn less with a program/erase cycle. On the other hand, in the third embodiment, in a state in which the wear has progressed, i.e., in a worn out state, the verify voltage Vvf is adjusted such that the verify voltage Vvf applied to the selected word line WL is high. In this way, the possibility of the loss of data included in the cell transistor MT is decreased, and accordingly, the reliability of the memory system 1 can be improved.

(Fourth Embodiment)

Next, a fourth embodiment will be described. The fourth embodiment is different from the first to third embodiments at least in a point in which the operations performed by the memory controllers 200 according to the first to third embodiments are performed by a host device 2. Configurations other than those described below are similar to the configurations according to the first embodiment.

<4.1 Configuration>

Figure 20:
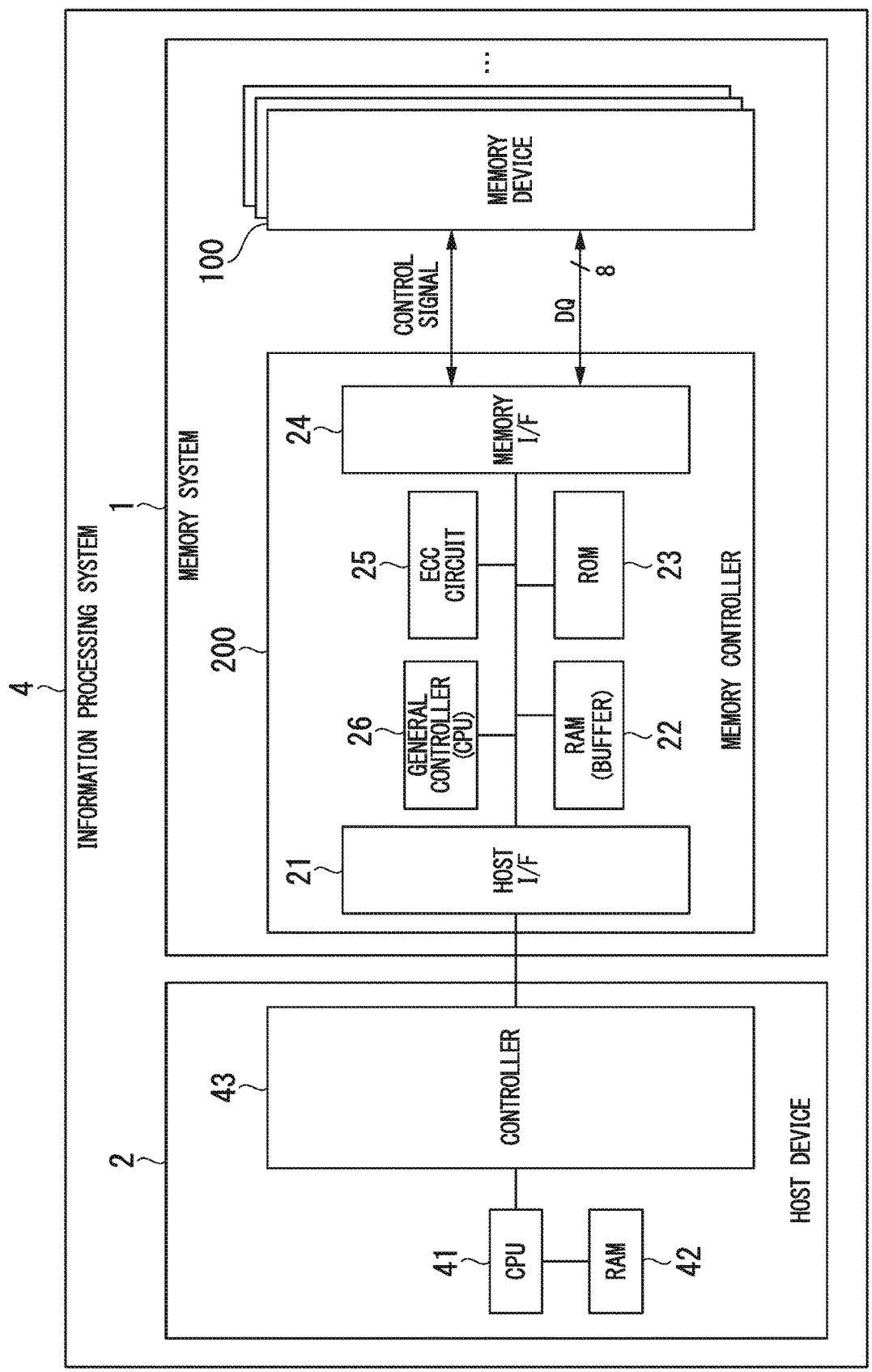
FIG. 20 is a block diagram showing a configuration of a memory system according to a fourth embodiment.

FIG. 20 shows functional blocks of an information processing system 4 according to a fourth embodiment. As shown in FIG. 20, the information processing system 4 includes a host device 2 and one or a plurality of memory systems 1. FIG. 20 shows an example in which one memory system 1 is included, and a description presented below relates to an example in which one memory system 1 is included.

The host device 2 includes a CPU 41, a RAM 42, and a controller 43. The RAM 42 stores various programs (firmware and/or software) and various kinds of data while the information processing system 4 is supplied with power and is in the On state. Examples of the stored programs include an operating system (OS), a file system, an application software layer, and the like. In the fourth embodiment, a part or the whole of the operation management table T1 and the adjustment value table T2 described in the first embodiment are stored in the RAM 42.

The CPU 41 performs various processes by executing a program on the RAM 42. The CPU 41 is connected to the controller 43 through a bus that is compliant with a communication standard such as PCIe. The CPU 41 communicates with the controller 43 in compliance with PCIe and controls the controller 43 in compliance with PCIe.

In addition, the controller 43 may be connected to each memory system 1 through a bus that is compliant with a communication standard such as ATA, SATA, or SAS. In a case where the interface with which the CPU is compliant and the interface with which the memory system 1 is compliant for communication with the outside are different from each other, the controller 43 converts a signal compliant with one of the two interfaces into a signal compliant with the other.

The host device 2, similar to the first embodiment, may instruct the memory system 1 to write data into the memory system 1, read data from the memory system 1, or erase data stored in the memory system 1. In addition, the host device 2 may transmit an instruction other than data writing, data reading, and data erasing to the memory system 1. Examples of such an instruction include output of a signal representing the state of the memory device 100, garbage collection that is started and managed by the host device 2, and data reading/writing/erasing under designated various conditions. The execution of the instruction of such a process for the memory system 1 is determined by the OS, the application software layer, the file system, and the like.

<4.2. Operation>

In the fourth embodiment, the use of an increment ΔVpgmL and the use of a verify voltage Vvf to which an adjustment value ΔVvf is added are determined by the host device 2. Then, the host device 2 instructs the memory system 1 to perform determined writing. In other words, the host device 2, similar to the instruction from the memory controller 200 to the memory device 100 according to the first to third embodiments, instructs the memory system 1 to perform verification by using a verify voltage VvfS adjusted according to the adjustment value. Then, the memory controller 200 performs writing instructed from the host device 2 for the memory device 100.

<4.3. Advantages>

According to the fourth embodiment, similar to the first to third embodiments, the verify voltage Vvf is adjusted by the host device 2. Accordingly, the same advantages as those of the first to third embodiments can be acquired.

As above, while the first to fourth embodiments have been described, the configuration of an embodiment is not limited to the examples described above. For example, the memory cell array 11 may include a plurality of sets of the stack body 112 and a plurality of pillars 113 described in the second embodiment in the first direction Z.

In addition, a predecessor word line WL (for example, a word line connected to a cell transistor MT in which data is written first) that is programmed prior to successor word lines WL is exposed to receiving pass voltages (Vpass) upon programming of the successor word lines WL afterwards. For this reason, the distribution of the threshold voltage for the predecessor word line WL that is programmed prior may be easily widened (for example, the tail of the high electric potential side may become longer easily). For this reason, the memory controller 200, similar to the first to fourth embodiments, by using the adjustment value ΔVvf of the verify voltage Vvf, causes a first verify voltage applied to the first (predecessor) word line WL programmed prior among a plurality of word lines WL to be lower than a second verify voltage applied to the second (successor) word line WL programmed after the first word line WL. Here, the first verify voltage is, for example, a verify voltage applied to the first word line WL in a case where it is determined whether writing of the first data value into the first cell transistor connected to the first word line WL has completed. In addition, the second verify voltage is, for example, a verify voltage applied to the second word line WL in a case where it is determined whether writing of the first data value into the second cell transistor connected to the second word line WL has completed.

In the first to fourth embodiments described above, a case (for example, a case where the function is realized by a software functional unit) has been described in which the function relating to the use of the increment ΔVpgmL and the adjustment of the verify voltage Vvf is realized by the memory controller 200 or the processor of the host device 2 executing a program. However, a part or the whole of the function relating to the use of the increment ΔVpgmL and the adjustment of the verify voltage Vvf may be realized by hardware such as a large scale integration (LSI), an application specific integrated circuit (ASIC), or a field-programmable gate array (FPGA) or may be realized by incorporating a software functional unit and hardware.

In addition, the function relating to the use of the increment ΔVpgmL and adjustment of the verify voltage Vvf described in the first to fourth embodiments may be realized by each memory device 100. In such a case, the function relating to the use of the increment ΔVpgmL and the adjustment of the verify voltage Vvf, for example, may be realized by the sequencer 12. In such a case, a part or the whole of the operation management table T1 and the adjustment value management table T2 are stored in the storage 11a of the memory device 100 or the register 121.

It is not essential for each functional block described in the first to fourth embodiments to be identified like that described as an example in the embodiments. For example, a part of a function may be performed by a functional block other than the exemplary functional block. In addition, any step in the flow of the method according to an embodiment is not limited to the sequence shown as an example and may be performed in a different sequence or in parallel with other steps unless otherwise mentioned.

According to at least one embodiment described above, in a case where it is determined whether writing of the first data value into the first cell transistor has been completed, the memory device is instructed to apply the first verify voltage to the first word line and, in a case where it is determined whether writing of the first data value into the second cell transistor has been completed, the memory device is instructed to apply the second verify voltage that s different from the first verify voltage to the second word line. Accordingly, a memory system and a method for controlling a memory system capable of performing improved control of the memory device can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory comprising a first cell transistor, a second cell transistor, a first word line, and a second word line,
the first word line and the second word line respectively being connected to the first cell transistor and the second cell transistor,
the nonvolatile memory being configured to write any one data value among one or more data values into each of the first cell transistor and the second cell transistor; and
a controller configured to:
instruct the nonvolatile memory to apply a first verify voltage to the first word line for determining whether writing of a first data value into the first cell transistor by using a first programming voltage has been completed, the first data value being one of the one or more data values; and
instruct the nonvolatile memory to apply a second verify voltage to the second word line for determining whether writing of the first data value into the second cell transistor by using the first programming voltage has been completed, the second verify voltage being different in a voltage level from the first verify voltage.

2. The memory system according to claim 1, wherein
the nonvolatile memory comprises a plurality of word lines, the plurality of word lines including the first word line and the second word line,
the first word line is a first-end word line of the plurality of word lines,
the plurality of word lines includes a second-end word line located on a side opposite to the first-end word line in the plurality of word lines, and
the second word line is located between the first-end word line and the second-end word line.

3. The memory system according to claim 2, wherein
the nonvolatile memory comprises a string of cell transistors that are electrically connected in series, the cell transistors including the first cell transistor and the second cell transistor, and
the first-end word line is located at a first end of the plurality of word lines that are connected to the string.

4. The memory system according to claim 2, wherein
the first verify voltage is lower than the second verify voltage.

5. The memory system according to claim 1, wherein
the nonvolatile memory comprises a plurality of word lines, the plurality of word lines including the first word line and the second word line, and the plurality of word lines and insulating layers are stacked alternately in a first direction, and
a size of the first cell transistor in a second direction is smaller than a size of the second cell transistor in the second direction, the second direction being substantially orthogonal to the first direction.

6. The memory system according to claim 5, wherein
the first verify voltage is lower than the second verify voltage.

7. The memory system according to claim 1, wherein
the nonvolatile memory comprises a plurality of cell transistors, the plurality of cell transistors including the first cell transistor and the second cell transistor,
the first verify voltage is used in a state where the controller determines that an average wear of the plurality of cell transistors is in a first wear range, and
the controller is configured to instruct the nonvolatile memory to apply a fifth verify voltage to the first word line for determining whether writing of the first data value into the first cell transistor has been completed in a state where the controller determines that the average wear of the plurality of cell transistors is in a second wear range, the fifth verify voltage being different in the voltage level from the first verify voltage, the second wear range being different from the first wear range.

8. The memory system according to claim 7, wherein
the average wear of the plurality of cell transistors in the second wear range is more severe than the average wear of the plurality of cell transistors in the first wear range, and
the fifth verify voltage is higher than the first verify voltage.

9. The memory system according to claim 1, wherein
the controller is further configured to:
instruct the nonvolatile memory to apply the first verify voltage to the first word line by transmitting a first adjustment value or a value acquired by using the first adjustment value to the nonvolatile memory; and
instruct the nonvolatile memory to apply the second verify voltage to the second word line by transmitting a second adjustment value or a value acquired by using the second adjustment value to the nonvolatile memory.

10. The memory system according to claim 9, wherein
the first verify voltage has a voltage level adjusted on the basis of the first adjustment value and a first common reference value, and the second verify voltage has a voltage level adjusted on the basis of the second adjustment value and the first common reference value.

11. The memory system according to claim 10, wherein
the controller is further configured to:
instruct the nonvolatile memory to apply, to the first word line, a third verify voltage that has a voltage level adjusted on the basis of the first adjustment value and a second common reference value for determining whether writing of a second data value into the first cell transistor has been completed, the second data value being one of the one or more data values and different from the first data value; and
instruct the nonvolatile memory to apply, to the second word line, a fourth verify voltage that has a voltage level adjusted on the basis of the second adjustment value and the second common reference value for determining whether writing of the second data value into the second cell transistor has been completed.

12. The memory system according to claim 10, wherein
the controller is further configured to:
instruct the nonvolatile memory to apply, to the first word line, a third verify voltage that has a voltage level adjusted on the basis of a third adjustment value and a second common reference value for determining whether writing of a second data value into the first cell transistor has been completed, the second data value being one of the one or more data values and different from the first data value; and
instruct the nonvolatile memory to apply, to the second word line, a fourth verify voltage that has a voltage level adjusted on the basis of a fourth adjustment value and the second common reference value for determining whether writing of the second data value into the second cell transistor has been completed.

13. The memory system according to claim 9, wherein
the nonvolatile memory comprises a plurality of word lines, the plurality of word lines including the first word line and the second word line,
the controller comprises a memory to store, at least temporarily, information associating a plurality of adjustment values with the plurality of word lines, the plurality of adjustment values including the first adjustment value and the second adjustment value, and
the controller is configured to acquire the first adjustment value corresponding to the first word line and the second adjustment value corresponding to the second word line from the information.

14. A memory system comprising:
a nonvolatile memory comprising a first cell transistor, a second cell transistor, a first word line, and a second word line which is not adjacent to the first word line,
the first word line and the second word line respectively being connected to the first cell transistor and the second cell transistor,
the nonvolatile memory being configured to write any one data value among one or more data values into each of the first cell transistor and the second cell transistor; and
a controller configured to:
instruct the nonvolatile memory to apply a first verify voltage to the first word line for determining whether writing of a first data value into the first cell transistor has been completed, the first data value being one of the one or more data values; and instruct the nonvolatile memory to apply a second verify voltage to the second word line for determining whether writing of the first data value into the second cell transistor has been completed, the second verify voltage being different in a voltage level from the first verify voltage.

15. The memory system according to claim 14, wherein the first verify voltage is adjusted on the basis of at least one adjustment value.

16. The memory system according to claim 14, wherein the nonvolatile memory comprises a plurality of word lines, the plurality of word lines including the first word line and the second word line, the first word line is a first-end word line of the plurality of word lines, the plurality of word lines includes a second-end word line located on a side opposite to the first-end word line in the plurality of word lines, and the second word line is located between the first-end word line and the second-end word line.

17. The memory system according to claim 14, wherein the nonvolatile memory further comprises a third word line located between the first word line and the second word line.

18. The memory system according to claim 14, wherein the nonvolatile memory further comprises a third cell transistor and a third word line, the third word line being connected to the third cell transistor, and the controller is further configured to instruct the nonvolatile memory to apply a third verify voltage to the third word line for determining whether writing of the first data value into the third cell transistor has been completed, the third verify voltage being different in the voltage level from the first verify voltage and the second verify voltage.

19. A method for controlling a memory system, the memory system comprising a nonvolatile memory configured to write any one data value among one or more data values into each of a first cell transistor and a second cell transistor, the nonvolatile memory including a first word line connected to the first cell transistor, a second word line connected to the second cell transistor, and a third word line located between the first word line and the second word line, the method comprising:

applying a first verify voltage to the first word line for determining whether writing of a first data value into the first cell transistor has been completed, the first data value being one of the one or more data values; and applying a second verify voltage to the second word line for determining whether writing of the first data value into the second cell transistor has been completed, the second verify voltage being different in a voltage level from the first verify voltage.

20. The method for controlling the memory system according to claim 19, wherein the nonvolatile memory comprises a plurality of word lines, the plurality of word lines including the first word line and the second word line, the first word line is a first-end word line of the plurality of word lines, the plurality of word lines includes a second-end word line located on a side opposite to the first-end word line in the plurality of word lines, and the second word line is located between the first-end word line and the second-end word line.

* * * * *